US009787093B2

(12) United States Patent
Covic et al.

(10) Patent No.: US 9,787,093 B2
(45) Date of Patent: Oct. 10, 2017

(54) LOCAL DEMAND SIDE POWER MANAGEMENT FOR ELECTRIC UTILITY NETWORKS

(71) Applicants: Auckland UniServices Limited, Auckland (NZ); Grant Anthony Covic, Mount Albert (NZ); John Talbot Boys, Albany (NZ); Joshua Reuben Lee, Remuera (NZ)

(72) Inventors: Grant Anthony Covic, Mount Albert (NZ); John Talbot Boys, Albany (NZ); Joshua Reuben Lee, Remuera (NZ)

(73) Assignee: Auckland UniServices Limited, Auckland (NZ)

( * ) Notice: Subject to any disclaimer, the term of this patent is extended or adjusted under 35 U.S.C. 154(b) by 395 days.

(21) Appl. No.: 14/425,665

(22) PCT Filed: Sep. 6, 2013

(86) PCT No.: PCT/NZ2013/000164
§ 371 (c)(1),
(2) Date: Mar. 4, 2015

(87) PCT Pub. No.: WO2014/038966
PCT Pub. Date: Mar. 13, 2014

(65) Prior Publication Data
US 2015/0214738 A1    Jul. 30, 2015

(30) Foreign Application Priority Data

Sep. 6, 2012   (NZ) .................................... 602303
Oct. 10, 2012  (NZ) .................................... 602937

(51) Int. Cl.
*H02J 3/14*     (2006.01)
*H02J 3/00*     (2006.01)
(Continued)

(52) U.S. Cl.
CPC .............. *H02J 3/00* (2013.01); *G01R 21/00* (2013.01); *H02J 3/14* (2013.01); *H02J 3/32* (2013.01);
(Continued)

(58) Field of Classification Search
USPC .............................................. 307/31, 38, 39
See application file for complete search history.

(56) References Cited

U.S. PATENT DOCUMENTS 5,442,335 A * 8/1995 Cantin ..................... H02J 3/08
                                                              307/31
5,834,855 A    11/1998 Chiba
(Continued)

FOREIGN PATENT DOCUMENTS

WO    WO-2008/140333        11/2008
WO    WO-2011/016736 A2     2/2011
WO    WO-2014/038966        3/2014

OTHER PUBLICATIONS

"International Application No. PCT/NZ2013/000164, International Search Report and Written Opinion mailed Dec. 2, 2013", (Dec. 2, 2013), 16 pgs.
(Continued)

*Primary Examiner* — Adam Houston
(74) *Attorney, Agent, or Firm* — Schwegman Lundberg & Woessner, P.A.

(57) ABSTRACT

A demand side electric power supply management system is disclosed. The system comprises an islanded power system having a point of coupling to a supply grid. The islanded power system supplies a plurality of electric loads, each of which is associated with a load controller to control the maximum power demanded by that load. A measuring means associated with the point of coupling measures the total power transfer between the grid and the islanded system, and a system controller monitors the measured
(Continued)

Figure 12:
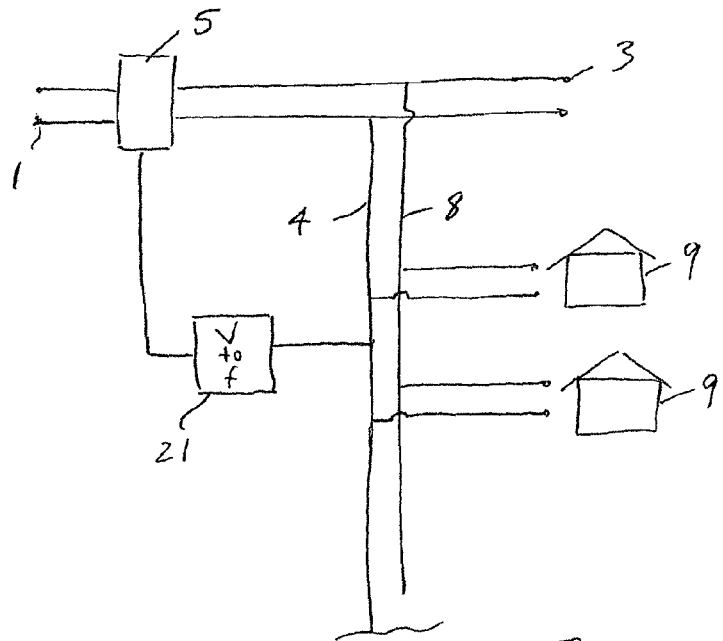

power transfer relative to a set point and provides a control signal to a plurality of load controllers. Each load controller receives substantially the same control signal and determines the maximum power which the or each load associated with the load controller is allowed to draw from the islanded power system based on information contained in the control signal.

15 Claims, 20 Drawing Sheets

(51) Int. Cl.
  H02J 3/32 (2006.01)
  H02J 3/38 (2006.01)
  G01R 21/00 (2006.01)
(52) U.S. Cl.
  CPC ............. *H02J 3/382* (2013.01); *H02J 3/386* (2013.01); *H02J 2003/003* (2013.01); *H02J 2003/143* (2013.01); *Y02B 70/3225* (2013.01); *Y02E 10/763* (2013.01); *Y02E 70/30* (2013.01); *Y04S 20/222* (2013.01); *Y10T 307/406* (2015.04)

(56) References Cited

U.S. PATENT DOCUMENTS

| | | | | |
|---|---|---|---|---|
| 8,805,597 | B2* | 8/2014 | Steffes | H02J 3/28 219/485 |
| 2004/0075343 | A1 | 4/2004 | Wareham et al. | |
| 2010/0060258 | A1* | 3/2010 | Aisa | H02J 3/00 324/76.39 |
| 2010/0085144 | A1* | 4/2010 | Aisa | G05B 19/0423 340/3.1 |
| 2013/0320762 | A1* | 12/2013 | Trudel | H02J 3/14 307/31 |
| 2014/0015418 | A1* | 1/2014 | Pandharipande | H05B 37/0218 315/152 |
| 2014/0084682 | A1* | 3/2014 | Covic | H02J 3/14 307/17 |
| 2015/0214738 | A1* | 7/2015 | Covic | H02J 3/32 307/31 |
| 2015/0220101 | A1* | 8/2015 | Aisa | H02J 3/14 307/31 |
| 2015/0244172 | A1* | 8/2015 | Trudel | H02J 3/12 307/129 |
| 2016/0013646 | A1* | 1/2016 | Akerson | H02J 3/14 307/39 |
| 2016/0190866 | A1* | 6/2016 | Pelletier | B60L 11/1842 307/64 |
| 2017/0012429 | A1* | 1/2017 | Nanda | H02J 3/382 |
| 2017/0126007 | A1* | 5/2017 | Trudel | H02J 13/0006 |

OTHER PUBLICATIONS

Short, Joe A., et al., "Stabilization of grid frequency through dynamic demand control", IEEE Transactions on Power Systems, 22 (3). pp. 1284-1293. ISSN 0885-8950, (Aug. 2007), 1284-1293.

* cited by examiner

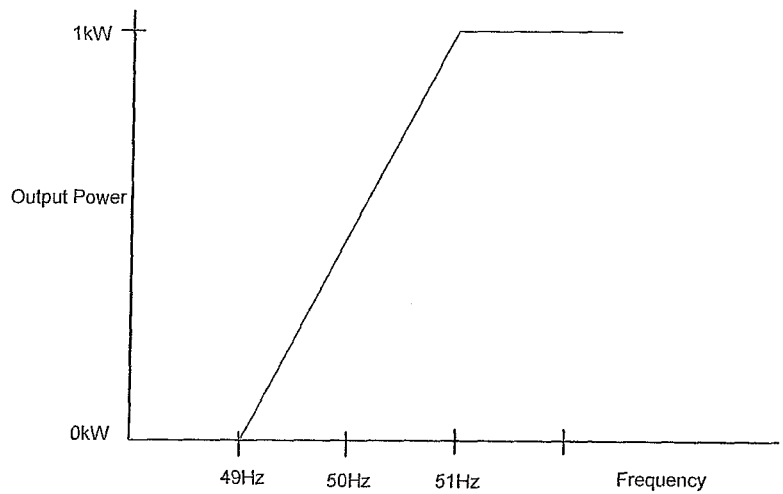
Figure 1. Power versus frequency for a 1 kW DDC Controller
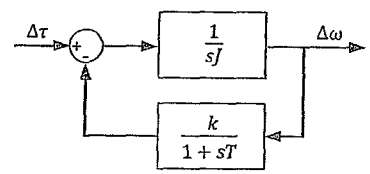
$$\frac{\Delta\omega}{\Delta\tau} = \frac{1+sT}{s^2JT+sJ+k}\frac{V1}{V0} = 1-\frac{1}{I_{sc}}$$
Figure 2. Block diagram, and transfer function of a DDC controller

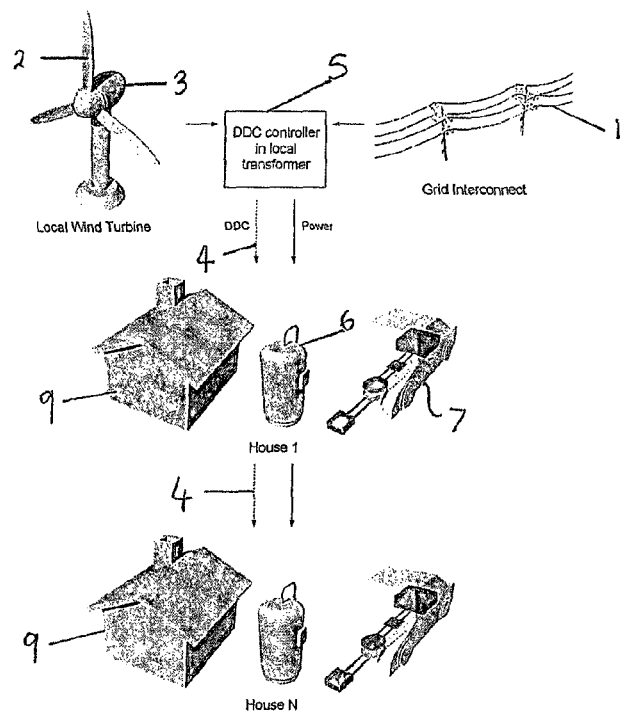
Figure 3 - Generalised schematic of a DGDC system
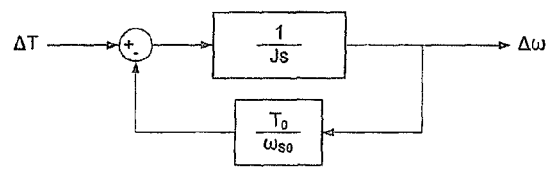
Figure 4 - Block diagram and Transfer function for a DGDC Controller
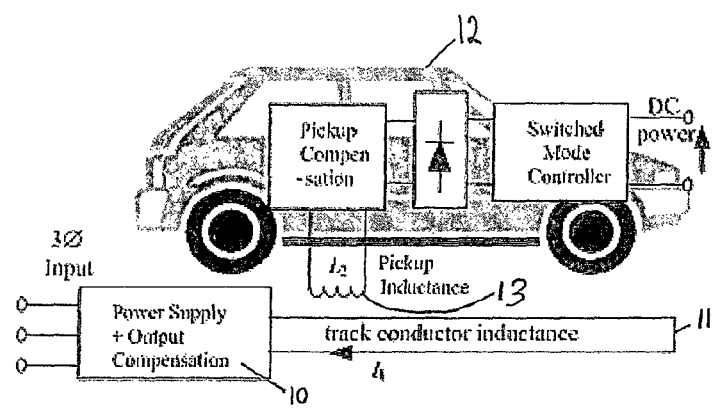
Figure 5 - A modern State of the Art EV

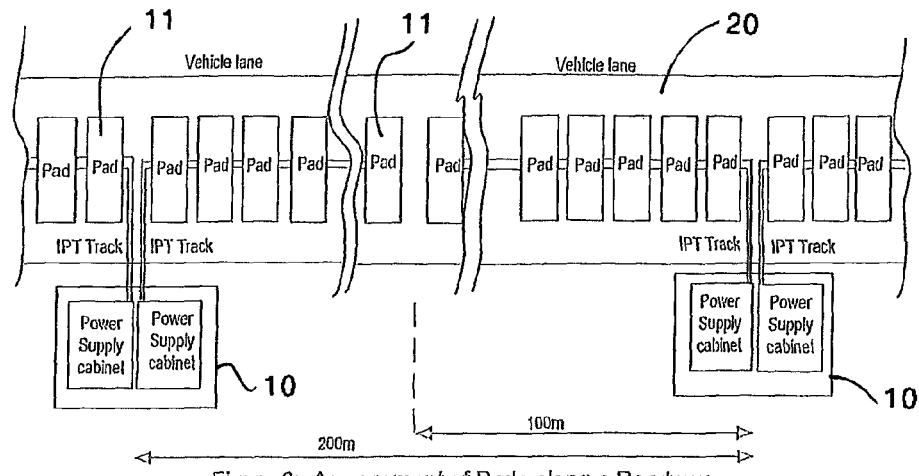
Figure 6: Arrangement of Pads along a Roadway
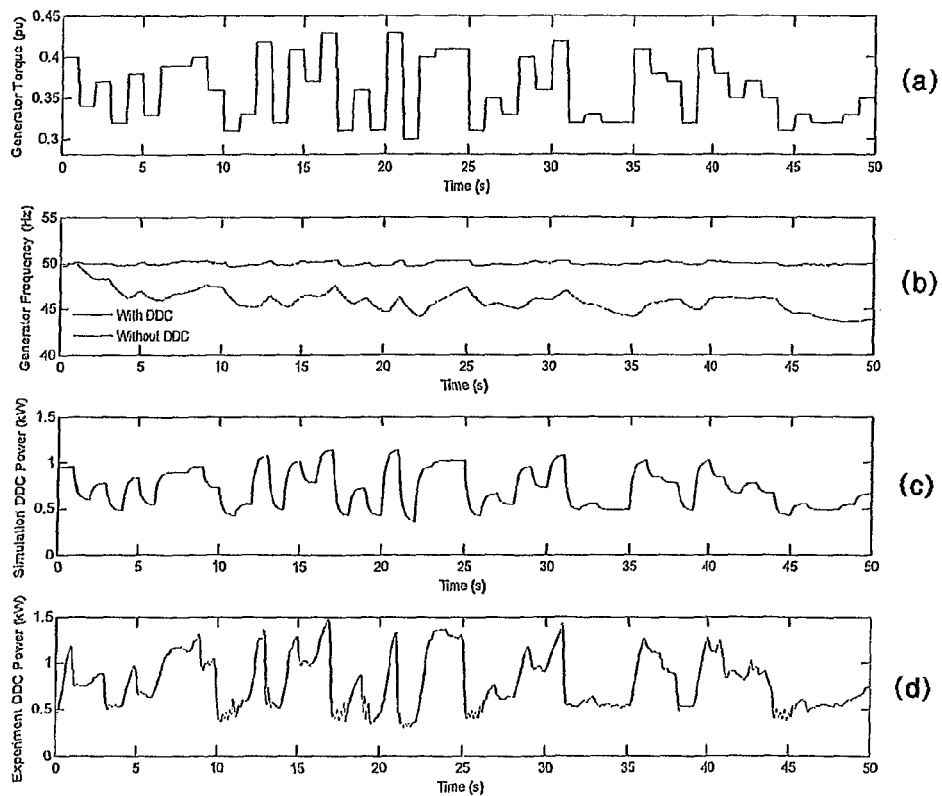
Figure 7 - Measured generator frequency and charging system output power with a DDC controlled IPT battery charging system and a random torque input.

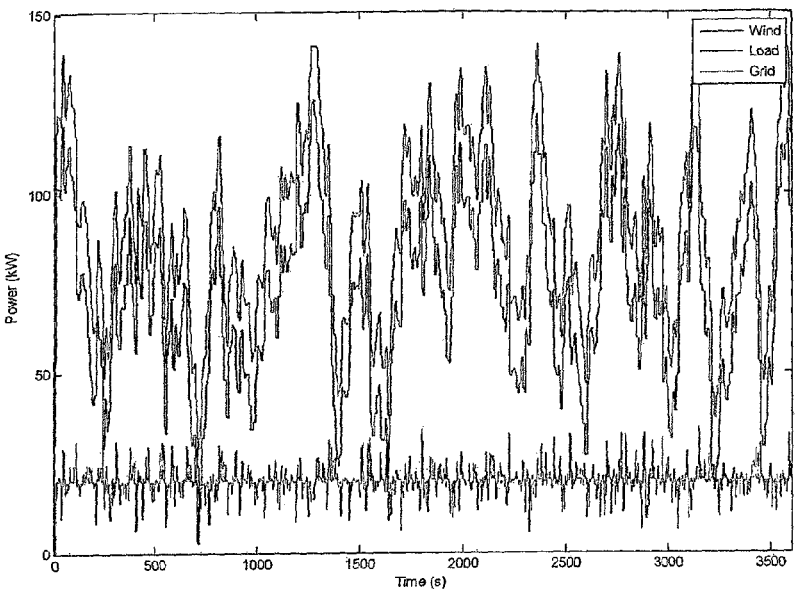
Figure 8 - Example plot of wind supply, grid supply and total consumption over a one hour period with a LDC controller.
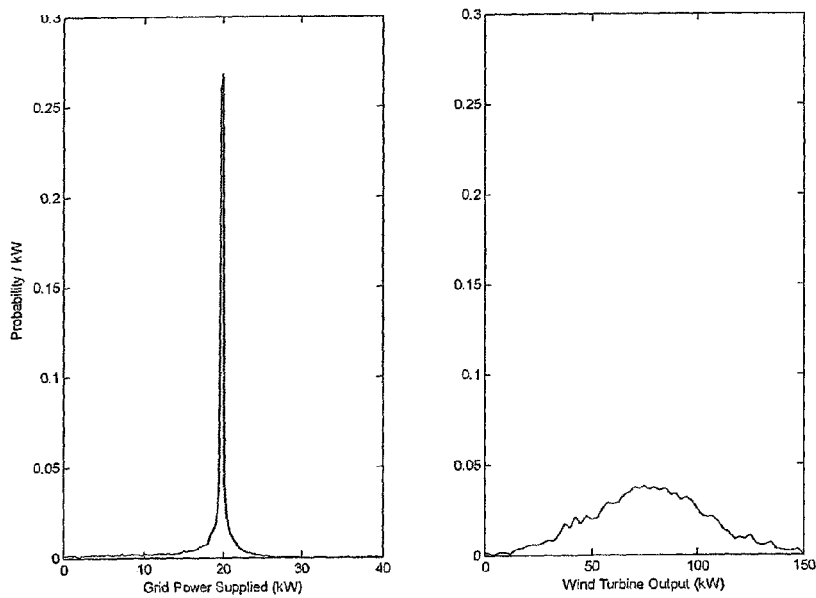
Figure 9 - Probability distribution of power consumed from the grid (left) and wind (right)

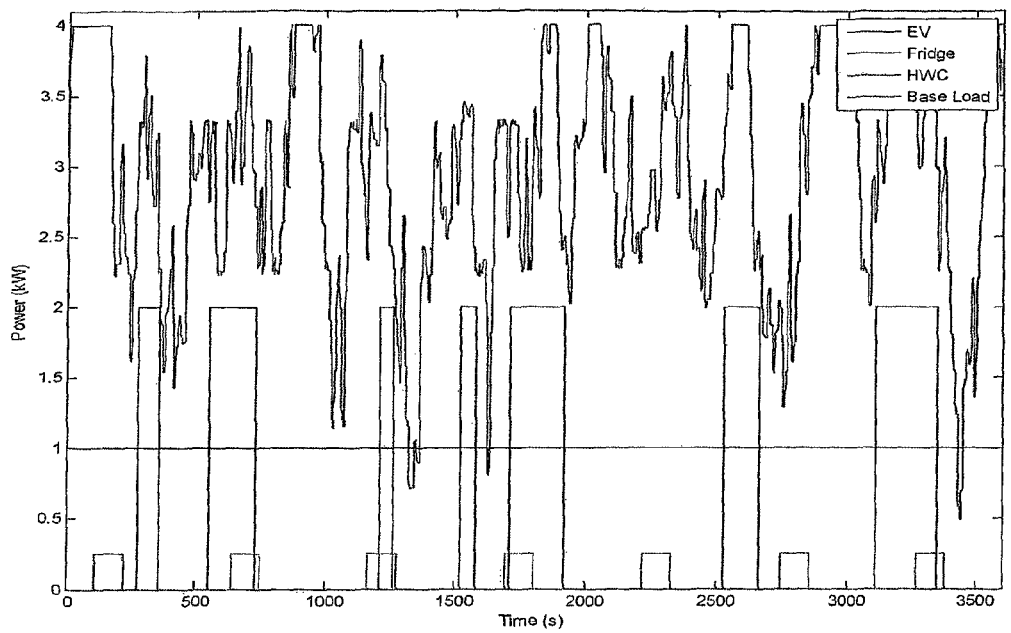
Figure 10 - Single household demand over one hour period
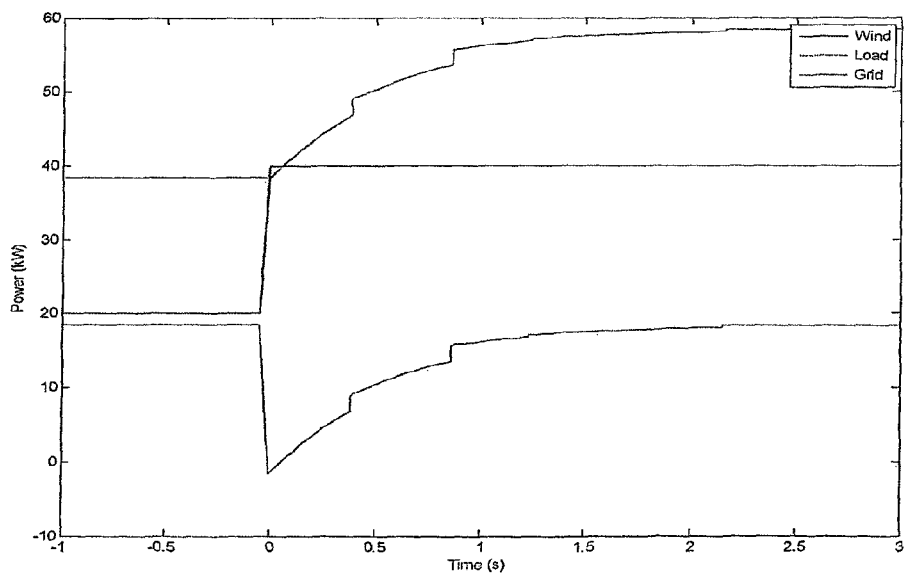
Figure 11 - Response of system to 20kW step in wind power.

LOCAL DEMAND SIDE POWER MANAGEMENT FOR ELECTRIC UTILITY NETWORKS

PRIORITY CLAIM TO RELATED APPLICATIONS

This application is a U.S. national stage application filed under 35 U.S.C.§371 from International Application Ser. No. PCT/NZ2013/000164, which was filed Sep. 6, 2013, and published as WO 2014/038966 on Mar. 13, 2014, and which claims priority to New Zealand Application No. 602303, filed Sep. 6, 2012, and to New Zealand Application No. 602937, filed Oct. 10, 2012, which applications and publication are incorporated by reference as if reproduced herein and made a part hereof in their entirety, and the benefit of priority of each of which is claimed herein.

FIELD OF THE INVENTION

This invention relates to methods, apparatus and systems for demand side power management in electrical utility networks. Applications of the invention include, but are not limited to, effective use of renewable energy generation resources and charging of electric vehicles.

BACKGROUND

Dynamic Demand Control (DDC) is conventionally known as a demand side management technique where the frequency of the utility supply, i.e. the grid frequency, is allowed to vary over a small range in response to fluctuations in the power being generated compared with the power being used at that moment. If the available power is too high the grid frequency is allowed to increase by a small amount; if the available power is too small the grid frequency is allowed to reduce. The grid may be viewed as a huge spinning load and these changes in frequency correspond to changes in the rotational speed of that load and are large energy fluctuations. If the frequency is too high then non-essential load can be switched on to absorb some of that energy; if it is too low then non-essential load can be switched off to free up spinning power for more important applications. Unless the context clearly requires otherwise, references to "DCC" herein refer to such a system.

In a practical situation a large number of small DDC capable loads, each with its own controller, are distributed over the network. As the network frequency varies each controller determines what load is called for and switches that fractional part load on. As shown in FIG. 1 if the frequency is less than 49 Hz the load switched is zero (W), if it is greater than 51 Hz the load is the full rated load, and between these two extremes the load varies linearly. Thus if there were 1 million of these devices on the network the actual load applied would be a resistive load variable from 0 to 2 GW. It should be noted that this is an example only and in practice the range 49-51 Hz would be a lot smaller, and not all the loads have to be the same. The prime requirement is that the DDC capable loads can be switched in a continuously variable way between 49 and 51 Hz—or at least switched on and off inside that range.

There are limitations on the type of load that can be made DDC compliant. In general 'energy' loads such as water heaters, battery chargers, freezers, refrigerators, and air conditioners are suitable but care must be taken where such loads include motors, pumps, and fans as rapid switching of these devices on and off may adversely affect their life. Nonetheless DDC compliant energy loads make up a significant fraction of the electric load on any grid system and make DDC an attractive technology to implement.

DDC is implemented in the simplest possible way by allowing the mains frequency to vary in response to loads. Schematically the whole grid can be replaced with a generator with inertia J and a load that varies with frequency shown in FIG. 2. A prime mover with no other controller drives the inertia J representing the Grid and DDC compliant loads (not shown) connected to the generator moderate the net torque driving the inertia J, via the feedback path.

| Symbol | Definition |
| --- | --- |
| $\Delta\tau$ | Change in input torque |
| J | System inertia |
| $\Delta\omega$ | System frequency |
| k | Constant for conversion between frequency and torque |
| T | Filter time constant |

Here changes in the input torque driving the system cause the system to change speed (frequency) according to the system inertia J. Changes in the speed are observed and used to change the load on the network to control the change in speed. Practically, there must be at least some filtering on the frequency measurement to remove non-linear effects caused by armature reactance changes and other disturbances. In fact without this filtering control is impossible. Thus aDDC controller has a feedback signal of $$\frac{k}{1+sT}$$

instead of simply k. In a practical application where generation is at 50 or 60 Hz this filtering may be achieved with a narrow band single pole band pass filter on the AC waveform to give the same transfer function for the envelope while at the same time filtering any other noise on the signal so that determining its frequency is simplified.

The transfer function of the system is therefore:

$$\frac{\Delta\omega}{\Delta\tau} = \frac{1+sT}{s^2JT+sJ+k}$$

Which has a damping factor of:

$$\zeta = \frac{1}{2}\sqrt{\frac{J}{kT}}$$

The system performance is therefore dependant on the system inertia, filtering constant and available controllable load. High gains and short time constants giving rapid response and high accuracy come at the expense of a low damping factor that is not acceptable. Thus the essence of control here is to always have enough inertia in the total power system. In our experience using a filter with a Q of 10 corresponding to a bandwidth of 5 Hz with control exercised over the range 49.5 to 50.5 Hz gives an acceptable response for inertias of greater than 0.02 kG.m$^2$/2-pole kW. Thus for a 100 kW 6-pole machine the required inertia with a Q of 10 is 0.02×(6/2)$^2$×100=18 kG.m$^2$ which is a substantial inertia. Since inertia increases as the 4$^{th}$ power of the machine diameter times the length inertias are more readily achieved with larger machines. However the biggest problem with DDC is that the system frequency varies so it cannot be seamlessly integrated into a grid network.

OBJECT

It is an object of the invention to provide an improved demand side control apparatus, method, system or process, or to at least provide the public with a useful choice.

SUMMARY

Accordingly in one aspect the invention broadly provides apparatus for production of a control signal for a demand side electric power supply management system, comprising:
means to accept set point;
measurement means to measure power flow into a supply network;
means to convert information from the measurement means into a control signal for transmission over the network wherein the frequency of the control signal is indicative of the power available to the network.

In one embodiment the network is supplied by a transformer and the measurement means measures the power supplied by or at the transformer.

The control signal may comprise a low voltage signal relative to the voltage of the network.

The apparatus for producing the control signals may be capable of sourcing a high current relative to the current required by individual loads supplied by the network.

In one embodiment the control signal comprises a signal in the range of substantially 1-3 volts at 50-500 A.

Preferably the control signal frequency is substantially in the range of 300-1200 Hz.

The control signal may be provided between a neutral line and an earth connection of the network. The control signal may also be inductively coupled to the network.

In one embodiment the apparatus derives the control signal by integrating the difference between the measured power flow and the set point.

The control signal may comprise the frequency of the power supplied over the network.

In another aspect the invention provides a utility power supply network including apparatus as set forth in any one of the preceding statements.

In another aspect the invention provides a method of providing a control signal for a demand side electric power supply management system, the method comprising:
measuring power flow into a supply network relative to a set point.
converting information from the measurement means into a control signal for transmission over the network wherein the frequency of the control signal is indicative of the power available on the network.

The method may include varying the set point.

In another aspect the invention provides a load controller for a demand side electric power supply management system, the controller comprising:
priority designation means for designating a priority for one or more loads supplied by the system;
frequency detection means for detecting the frequency of a control signal;
means to control the one or more loads dependent on the control signal and designated priority assigned to that or each load.

The control signal may be obtained directly from the network supply power to the one or more loads.

Preferably the supply network comprises a local demand control network.

Preferably the local demand control network comprises an islanded power system.

Preferably the control signal is nominally 800 Hz.

In another aspect the invention broadly provides a demand side electric supply management system comprising an islanded power system having a point of coupling to a supply grid, the islanded power system supplying a plurality of consumers, each consumer using one or more electric loads, each of the loads associated with a load controller to control the power demanded by that load in response to a control signal, a measuring means associated with the point of coupling to measure the total power transfer between the grid and the islanded system, and a system controller which monitors the measured power transfer into the islanded system relative to a set point and provides a control signal to one or more load controllers by coupling a variable frequency signal to the islanded system power distribution network to prevent power transfer into the islanded system substantially exceeding the set point.

Preferably the load controller includes a filter means to detect the control signal.

Preferably the control signal is nominally 800 Hz

In another aspect the invention broadly provides a demand side electric power supply management system including a power system comprising group of loads and/or supplies having a point of coupling to a supply grid, the system supplying a plurality of consumers, each consumer using one or more electric loads, each of the loads associated with a load controller to control the power demanded by that load in response to the frequency of the power supply in the system, a measuring means associated with the point of coupling to measure the total power transfer between the grid and the system, and a system controller which monitors the measured power transfer into the system relative to a set point and adjusts the frequency of the power supply in the system to prevent power transfer into the system substantially exceeding the set point.

Preferably the frequency of the power supply in the system is adjusted using an electronic transformer.

Preferably each load controller receives substantially the same control signal and determines the maximum power which the or each load associated with the load controller is allowed to draw from the power system based on information contained in the control signal.

The load controller may prioritise its load(s) with respect to another load or other loads whereby a load of a first priority is controlled to draw power in preference to a load of a second priority for a given control signal. For example a load of a first priority is controlled to reduce demand after a load of a second priority in response to a change in the control signal to indicate that demand needs to be reduced. The priorities assigned to loads may be changed. In one embodiment priorities may be changed dependent on the function performed by the load.

The power flow into the system may be substantially maintained at the set point.

In one embodiment the set point represents a base power requirement for the system. The base power requirement may be established by the consumer(s) and/or by the load controller or a grid system operator. The base power requirement, and thus the set point, may be varied. This may be dependent upon factors such as the power requirements of the system, the cost structure for power supplied by the grid, and the overall power demand on the grid i.e. the power available to the system from the grid.

The system may include one or more generators. In one embodiment, generation within the system results in less power transferred from the grid, thereby causing the control signal to indicate that the loads may demand more power. In one embodiment, if all loads are fully supplied, then excess generation in the islanded system may be transferred to the grid.

In one embodiment the control signal is derived by measuring the total energy supplied to the system compared with the energy that would have been supplied if the system had operated continuously at the set point reference.

In another embodiment the control signal is delivered to the load controller by a low latency communication system, the system controller monitors power transfer to the system relative to a set point for power transfer from the grid to the islanded system to thereby establish a differential power transfer, and provides a control signal to the one or more load controllers such that the differential power transfer substantially averages zero.

The load controller may prioritise its load(s) with respect to another load or other loads whereby a load of a first priority is controlled to draw power in preference to a load of a second priority for a given control signal. For example loads of a first priority are controlled to reduce demand after loads of a second priority in response to a change in the control signal to indicate that demand needs to be reduced. The priorities assigned to loads may be changed. In one embodiment priorities may be changed dependent on the function performed by the load.

The power flow into the system may be substantially maintained at the set point.

In one embodiment the set point represents a base power requirement for the system. The base power requirement may be established by the consumer(s) and/or by the load controller or a grid system operator. The base power requirement, and thus the set point, may be varied. This may be dependent upon factors such as the power requirements of the system, the cost structure for power supplied by the grid, and the overall power demand on the grid i.e. the power available to the system from the grid.

The system may include one or more generators. In one embodiment, generation within the system results in less power transferred from the grid, thereby causing the control signal to indicate that the loads may demand more power. In one embodiment, if all loads are fully supplied, then excess generation in the system may be transferred to the grid.

In one embodiment the control signal is derived by measuring the total energy supplied to the system compared with the energy that would have been supplied if the system had operated continuously at the set point reference.

In another aspect of the invention there is provided a method of demand side electric power supply management comprising the steps of:
 establishing a set point reference for power transfer from a supply grid to a power system having a plurality of loads or supplies;
 monitoring power transfer from the grid to the power system relative to the set point reference to thereby establish a differential power transfer;
 generating one or more control signals to control the loads present in the system such that the differential power transfer substantially averages zero, and;
 providing the one or more control signals over the power supply network of the system.

The method may include prioritising one or more loads with respect to another load or other loads whereby a load of a first priority is controlled to draw power in preference to a load of a second priority for a given control signal. For example loads of a first priority are controlled to reduce demand after loads of a second priority in response to a change in the control signal to indicate that demand needs to be reduced. The priorities assigned to loads may be changed. In one embodiment priorities may be changed dependent on the function performed by the load.

The method may include maintaining power flow into the islanded system at a substantially set point.

In one embodiment the set point represents a base power requirement for the system. The base power requirement may be established by the consumer(s) and/or by the load controller or a grid system operator. The base power requirement, and thus the set point, may be varied. This may be dependent upon factors such as the power requirements of the system, the cost structure for power supplied by the grid, and the overall power demand on the grid i.e. the power available to the system from the grid.

The system may include one or more generators. In one embodiment, generation within the system results in less power transferred from the grid, thereby causing the control signal to indicate that the loads may demand more power. In one embodiment, if all loads are fully supplied, then excess generation in the system may be transferred to the grid.

In one embodiment the control signal is derived by measuring the total energy supplied to the system compared with the energy that would have been supplied if the system had operated continuously at the set point reference.

In another aspect the invention provides a demand side electric power supply management system controller having:
 means to monitor power transfer from a supply grid to a power system having a plurality of loads and/or supplies;
 means to compare the power transfer from the grid to the islanded power system relative to a set point reference for power transfer from the grid to the system to thereby establish a differential power transfer power flow into the system; and
 means to generate a control signal for transmission over the power supply network of the system to control loads present in the system such that the differential power transfer substantially averages zero.

The load controller may prioritise its load(s) with respect to another load or other loads whereby a load of a first priority is controlled to draw power in preference to a load of a second priority for a given control signal. For example loads of a first priority are controlled to reduce demand after loads of a second priority in response to a change in the control signal to indicate that demand needs to be reduced. The priorities assigned to loads may be changed. In one embodiment priorities may be changed dependent on the function performed by the load.

The power flow into the islanded system may be substantially maintained at the set point.

In one embodiment the set point represents a base power requirement for the system. The base power requirement may be established by the consumer(s) and/or by the load controller or a grid system operator. The base power requirement, and thus the set point, may be varied. This may be dependent upon factors such as the power requirements of the system, the cost structure for power supplied by the grid, and the overall power demand on the grid i.e. the power available to the system from the grid.

The system may include one or more generators. In one embodiment, generation within the system results in less power transferred from the grid, thereby causing the control signal to indicate that the loads may demand more power. In one embodiment, if all loads are fully supplied, then excess generation in the system may be transferred to the grid.

In one embodiment the control signal is derived by measuring the total energy supplied to the system compared with the energy that would have been supplied if the system had operated continuously at the set point reference.

In another aspect the invention provides a method of demand side electric power supply management comprising the steps of:
- assigning a priority to each of a plurality of loads in a power system;
- receiving a control signal indicative of the power available to the power system; and
- controlling the loads dependent on the control signal and the priority assigned to each load whereby a load of a first priority is controlled to draw power in preference to a load of a second priority for a given power availability indication from the control signal.

In one embodiment the power system comprises an islanded power system.

The control signal may be provided using a low latency communication system. The control signal may comprise the frequency of operation of the power system.

The islanded power system may receive power from a grid supply.

In another aspect the invention provides a load controller for a demand side electric power supply management system, the controller comprising:
- priority designation means for one or more loads;
- means for receiving a control signal, the control signal indicative of the power available to a power system which supplies the one or more loads; and
- means to control the one or more loads dependent on the control signal and designated priority assigned to that load.

In one embodiment the load controller stores a priority designation for each of a plurality of loads and controls the loads dependent on the control signal and the designated priority whereby a load of a first priority is controlled to draw power in preference to a load of a second priority for a given power availability indication from the control signal.

In one embodiment the power system comprises an islanded power system.

The control signal may be provided using a low latency communication system. The control signal may comprise the frequency of operation of the power system.

The islanded power system may receive power from a grid supply.

In another aspect the invention broadly provides an appliance for use with a demand side electric power supply management system, the appliance comprising:
- a priority designation means;
- means for receiving a control signal, the control signal indicative of the power available to a power system which supplies the appliance; and
- means to control the power demand of the appliance dependent on the control signal and designated priority.

In another aspect the invention broadly provides a demand side electric power supply management system comprising an islanded power system having a point of coupling to a supply grid and a variable power supply from a generator connected to the islanded system, the islanded power system supplying a plurality of consumers, each consumer using at least one load, each of the loads associated with a load controller to control the power demanded by that load in response to a control signal which is delivered to the load controller by a low latency communication system, a system controller which provides a control signal to the one or more load controllers such that the power from the generator is preferentially supplied to energy loads.

In another aspect the invention broadly provides an electric vehicle power supply management system comprising an islanded power system capable of supplying power to a plurality of electric vehicle loads and having a point of coupling to a supply grid, each of the loads associated with a load controller to control the power demanded by that load in response to a control signal which is delivered to the load controller by a low latency communication system, a system controller which monitors power transfer to the islanded system relative to a set point for power transfer from the grid to the islanded system to thereby establish a differential power transfer, and provides a control signal to the one or more load controllers such that the differential power transfer substantially averages zero.

In one embodiment the electric vehicle loads are inductively coupled to the islanded power system.

In one embodiment the islanded system is arranged to provide power inductively to the electric vehicle loads when the electric vehicles are on a vehicle carrying surface such as a garage floor, carpark or roadway.

In another aspect the invention provides a method of demand side electric power supply management comprising the steps of:
- assigning a priority to each of a plurality of loads in a power system;
- receiving a control signal indicative of the power available to the power system;
- monitoring a characteristic of at least one of the loads; and
- reassigning the priority for one or more of the loads dependent on the control signal and the monitored characteristic.

The monitored characteristic may include one or more of: the power presently demanded by the load; the state of charge of the load; whether the load has been switched off or on by a user.

In one embodiment the power system comprises an islanded power system.

The control signal may be provided using a low latency communication system. The control signal may comprise the frequency of operation of the power system.

The islanded power system may receive power from a grid supply.

In another aspect the invention provides a demand side electric power supply management system comprising an islanded power system having at least one point of coupling to a supply grid, the islanded power system supplying a plurality of electric loads, each said load associated with a load controller to control the maximum power demanded by that load, the system further comprising measuring means associated with the or each point of coupling to measure the total power transfer between the grid and the islanded system, wherein each load controller determines the maximum power which the or each load associated with the load controller is allowed to draw from the islanded power system based on a comparison of the measured power transfer into the system with a set point.

In another aspect the invention broadly provides a load controller for a demand side electric power supply management system, the controller comprising:

a priority designation means for one or more loads or supplies;

filter means for detecting a control signal; and means to control the one or more loads or supplies dependent on the control signal and designated priority assigned to that load or supply.

In one embodiment the loads comprise a selected group.

In one embodiment the group may comprise an islanded system.

In one embodiment the control signal is indicative of the power available to the group/Island.

In one embodiment the control signal is dependent on a sum, or difference, or ratio, or other relation between the rate of power supply will drain by the group/Island and a desired or set point rate.

In one embodiment the control signal is a high ampere, low voltage electrical tone signal which can be filtered using economical filters out a 50 Hz AC signal. The voltage may be in the order of one or 2 V and the current may be in the order of an Amp upwards. Preferably the control signal is detectable at the neutral of electrical supply wiring. This may be in reference to phase or positive.

The group of loads may or may not be islanded.

In another aspect the invention broadly provides an electric power supply management system comprising a power system connected to a supply grid at one or more points to transfer a power to or from the grid, the power system supplying a plurality of consumer sites with power from the grid or supplying the grid with power, each consumer site using one or more electric loads, each of the loads associated with a load controller to control the power demanded by that load, a measuring means associated with measure the total power transfer between the grid and the islanded system, and a system controller which monitors the measured power transfer between the system and the grid system relative to a power or energy constraint and provides a control output suitable the load controllers to use, the control output dependent upon the constraint and the total power transfer between the system and the grid. The constraint may be a set point of energy in a time period or a rate of power.

Preferably control data adjusts the frequency of the power supply in the islanded system to prevent power transfer into the islanded system substantially exceeding the set point.

In another aspect the invention broadly provides apparatus for the production of a control signal for an electric power supply management system, the apparatus comprising:

means to accept a desired set-point, means to measure the power flow into an islanded network, means to convert the measurement or information relating to the measurement into a control signal.

In one embodiment the set-point is provided by a grid operator.

In one embodiment the set-point may be updated and controlled at set intervals or continuously by the grid operator or islanded system.

In one embodiment the difference between the power flow into the islanded network and the set-point is measured and integrated to create the measurement.

In one embodiment the power measurement is converted into a frequency control signal.

In another aspect the invention broadly provides apparatus for communicating a control signal in an electric power supply management system, the apparatus comprising:

means to accept an input signal, means to create a low voltage high current signal, means to apply the to a neutral line.

In one embodiment the signal is 2-3V at 100 A and uses a frequency between 600-800 Hz.

In one embodiment an inverter is used to inject or couple the control signal onto the neutral line.

In one embodiment the means for communicating is used to control an LDC system.

In another aspect the invention broadly provides for a load control device, for provision between a power supply and a load, the load control device comprising:

means to respond to a control signal, means to change the amount of power provided to a load based on the control signal.

In one embodiment the load control device comprises a dongle.

In one embodiment the load control device is reprogrammable.

In one embodiment the load control device can be connected to an external device for reprogramming or monitoring.

In one embodiment the load control device includes manual controls to change the priority of the load switching.

In one embodiment the response to the control signal is dependant on the priority of the device.

In one embodiment the load control device is part of an appliance.

In one embodiment the load control device is part of an LDC system.

In another aspect the invention broadly provides for an appliance with an included load control device.

In one embodiment a feature of the load control device is dependent on the appliance.

In one embodiment the load control device is reprogrammable through the controls of the appliance.

In one embodiment the load control device is visible on the appliance.

In another aspect the control signal of the electrical power supply management system is available to a monitor means, the monitor means being adapted to:

display and record the control signal, track the historical values of the control signal.

In one embodiment the monitor means is available to a grid operator and allows tracking of the power used by the islanded system.

In one embodiment the monitor means is available to one or more users of the islanded power system.

References to loads in the foregoing statements may also include sources or supplies i.e. generators and/or supplies (such as batteries) of electricity, so that the system can be used to control a supply which supplies the grid.

Although this document refers by way of example to an islanded system, use of that term is intended to generally include a group of electrical loads and/or supplies, as well as the specific instance of an islanded system.

Further aspects of the invention, which should be considered in all its novel aspects, will become apparent from the following description.

DRAWING DESCRIPTION

Figure 13:
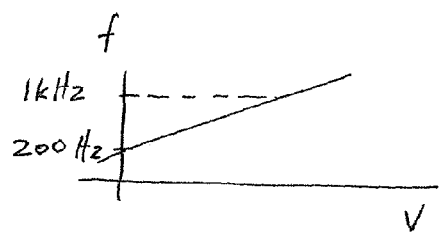
Figure 14:
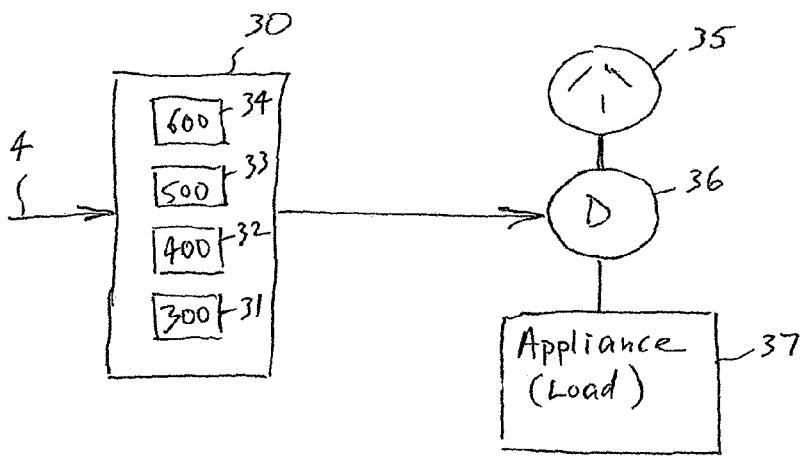
Figure 15:
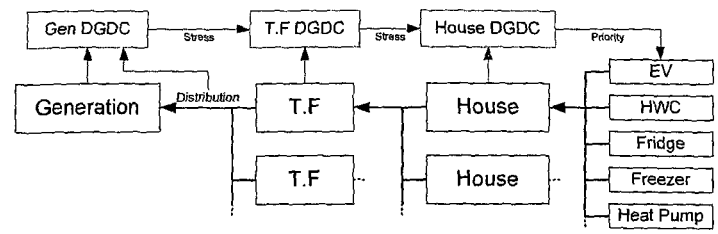
Figure 16:
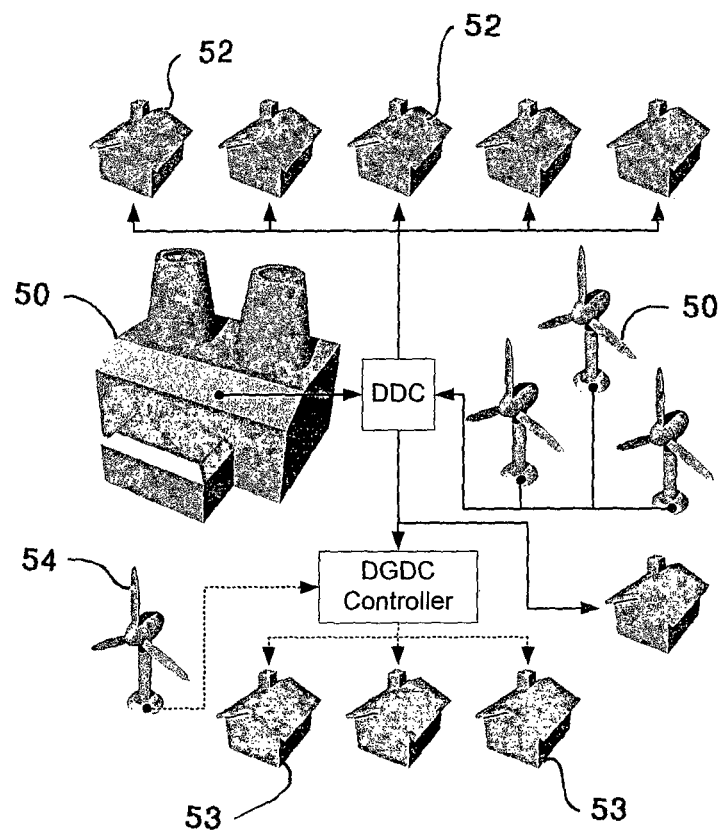
Figure 17:
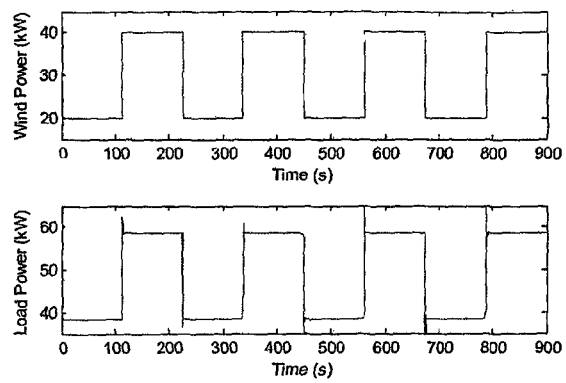

One or more embodiments of the invention will be described below with reference to the accompanying drawings, in which:

FIG. 1: is a graph of Power versus frequency for a known 1 kW DDC Controller;

FIG. 2: is a Block diagram, and transfer function of a known DDC controller;

FIG. 3: is a generalised schematic diagram of a LDC system according to the invention;

FIG. 4: is a Block diagram, and transfer function of a known DDC controller;

FIG. 5: is a diagrammatic illustration of an inductively powered electric vehicle;

FIG. 6: is an illustration of a roadway for inductively powered vehicles;

FIG. 7: is a series of graphs showing measured generator frequency and charging system output power with a DDC controlled IPT battery charging system and a random torque input;

FIG. 8: is a graph showing an example plot of wind supply, grid supply and total consumption over a one hour period with an LDC controller;

FIG. 9: shows two probability distributions, one for power consumed from a grid and the other for power consumed from wind;

FIG. 10: is a graph showing single household demand over a one hour period;

FIG. 11: is a graph showing the system response to a 20 kW step in wind power;

FIG. 12: is a diagram of an islanded power system illustrating generation and use of a variable frequency control signal;

FIG. 13: is a diagram of frequency against voltage for generation of the control signal in the system shown in FIG. 12;

FIG. 14: is a diagram showing operation of a load control device;

FIG. 15: is a diagram showing information flows in an LDC island according to one embodiment of the invention;

FIG. 16: is a diagram illustrating an example of a hybrid system which integrates DDC and LDC;

FIG. 17: shows plots of wind power and load power over time; and

Figure 18:
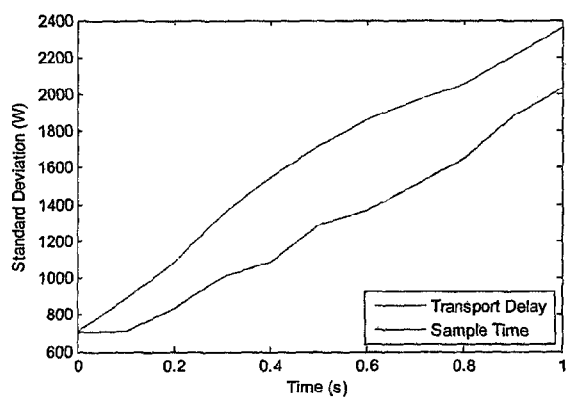
Figure 19:
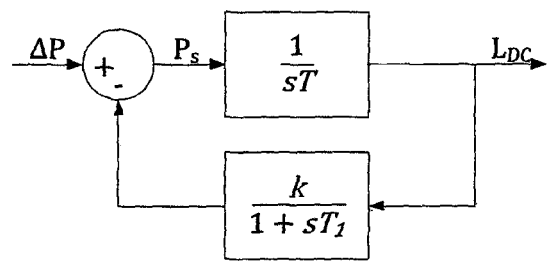
Figure 20:
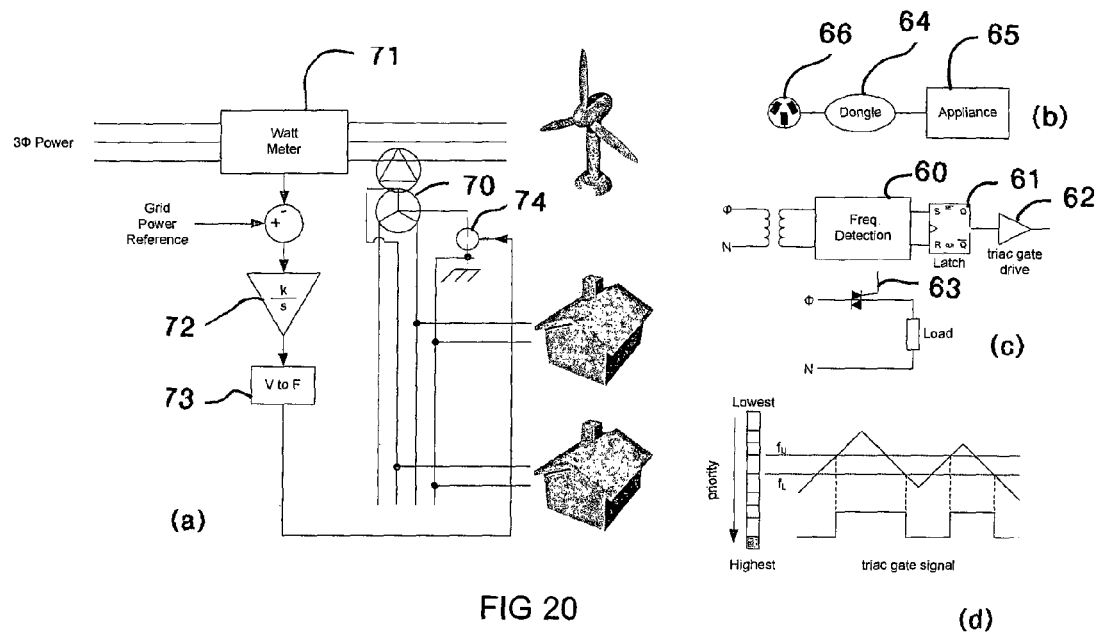
Figure 21:
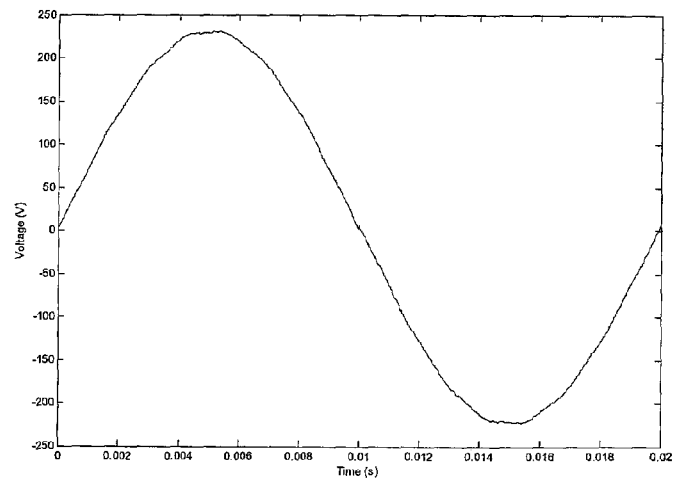
Figure 22:
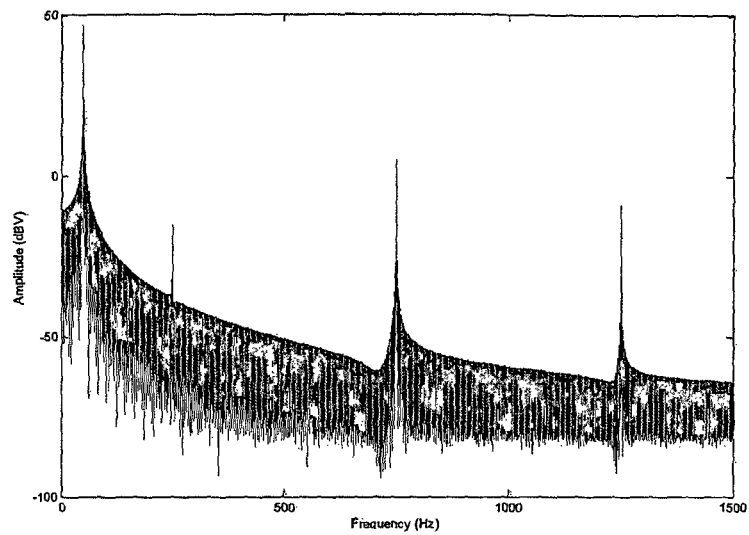
Figure 23:
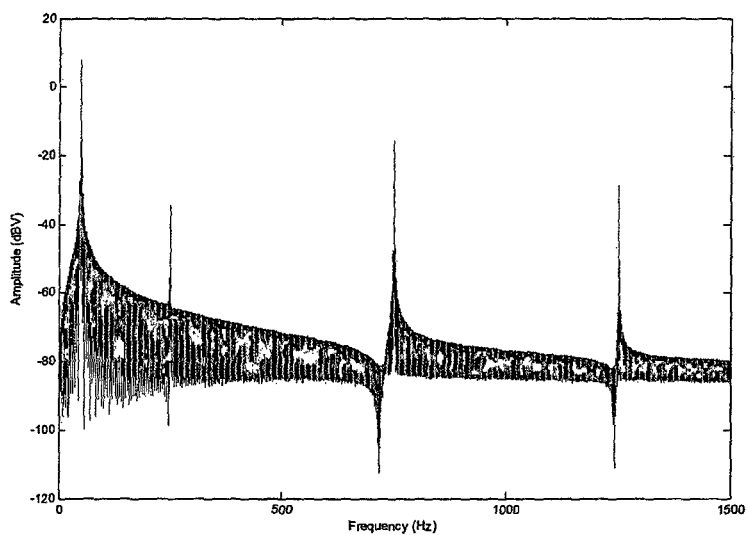
Figure 24:
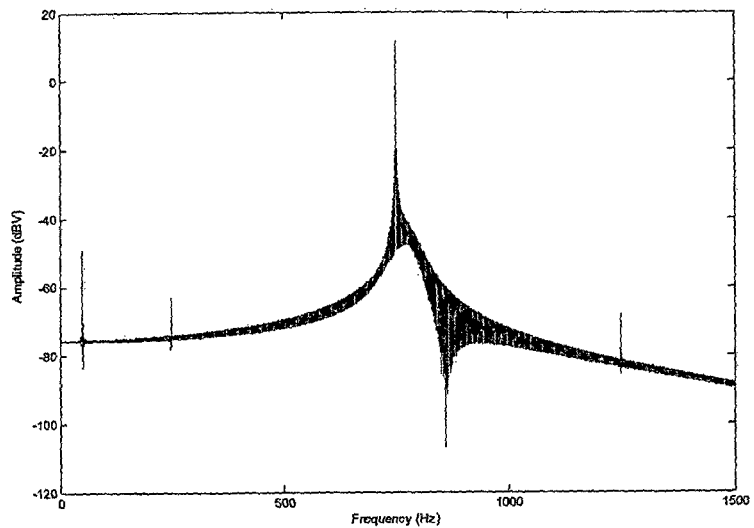
Figure 25:
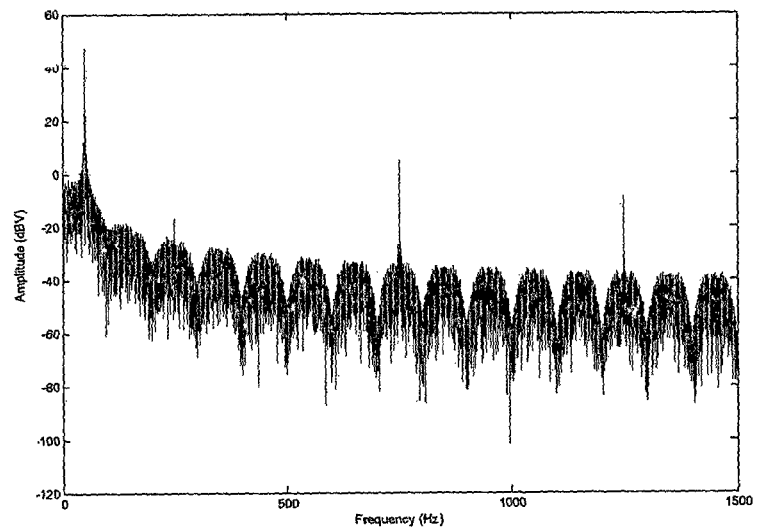

FIG. 18: shows plots of standard deviation against time for Transport Delay and Sample Time in respect of the simulation relating to FIG. 17;

FIG. 19: is a block diagram of another embodiment of an LDC control system;

FIG. 20: shows a schematic diagram of another embodiment of an LDC system and controller;

FIG. 21: shows a simulation of an input signal containing both a 50 Hz mains and 800 Hz LDC signal;

FIG. 22: is a frequency spectrum of the input shown in FIG. 21;

FIG. 23: shows the output of a high pass filter fed with the input signal of FIG. 21;

FIG. 24: shows the output of a band pass filter fed with an input signal from the output of the high pass filter of FIG. 23;

FIG. 25: shows the input spectrum with noise of ~$3V_{RMS}$.

Figure 26:
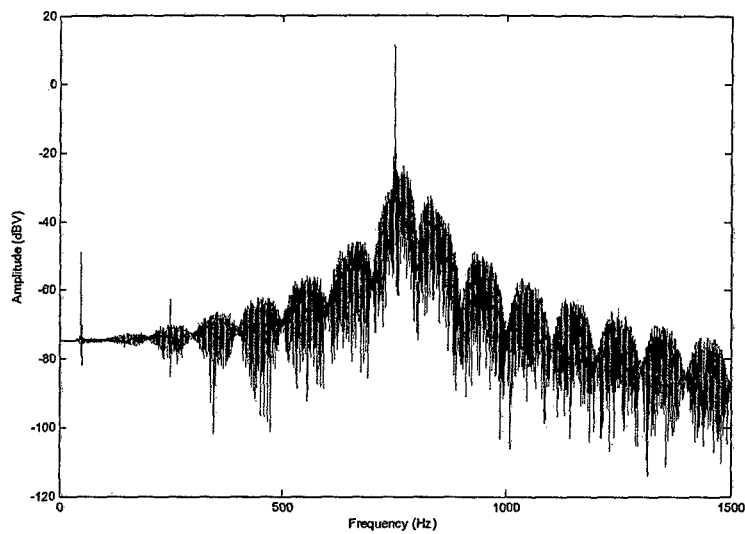

FIG. 26: shows the output spectrum noise of ~$3V_{RMS}$.

Figure 27:
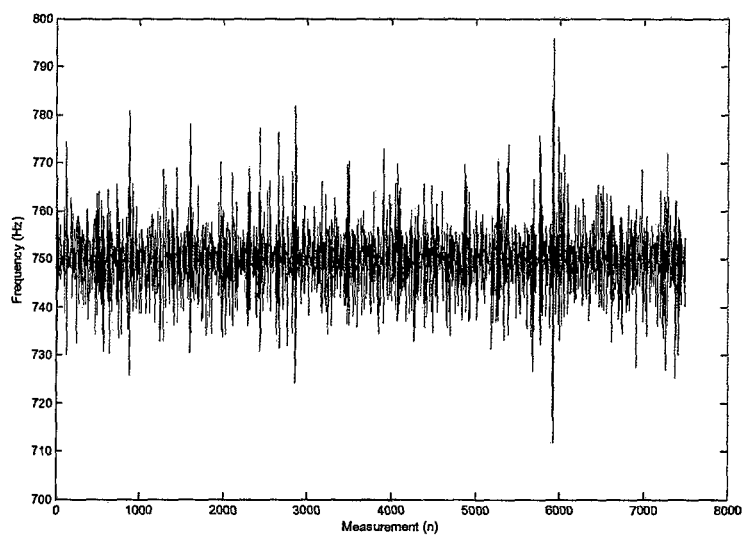

FIG. 27: is a plot of the raw measurement output.

Figure 28:
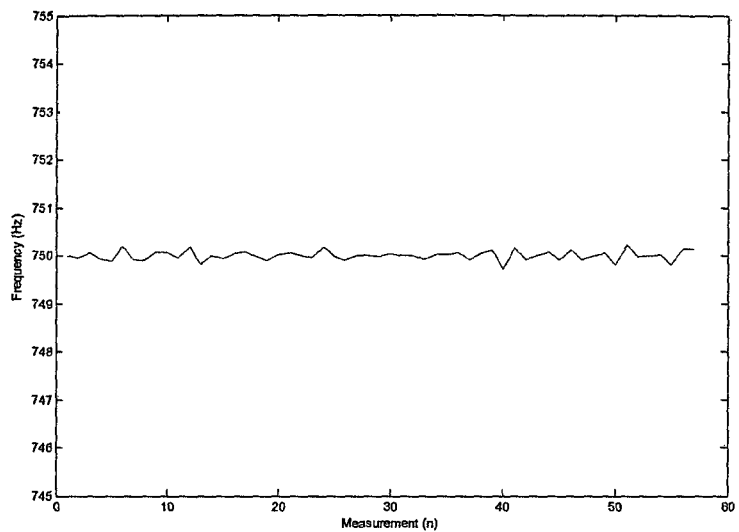
Figure 29:
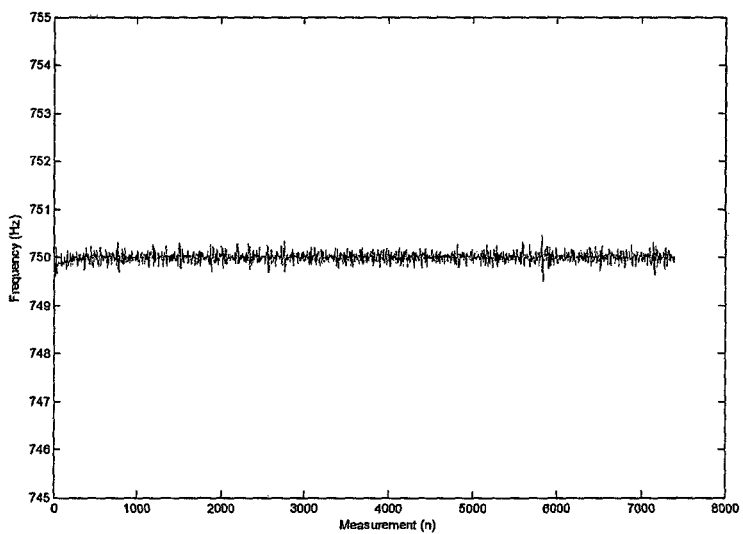
Figure 30:
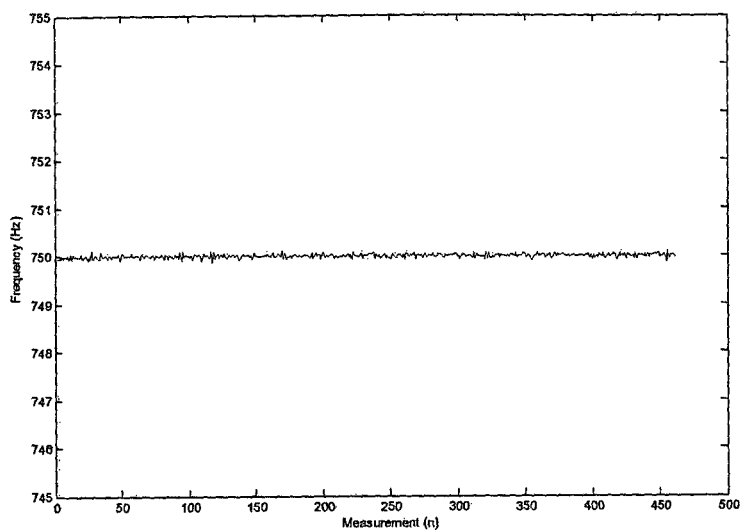
Figure 31:
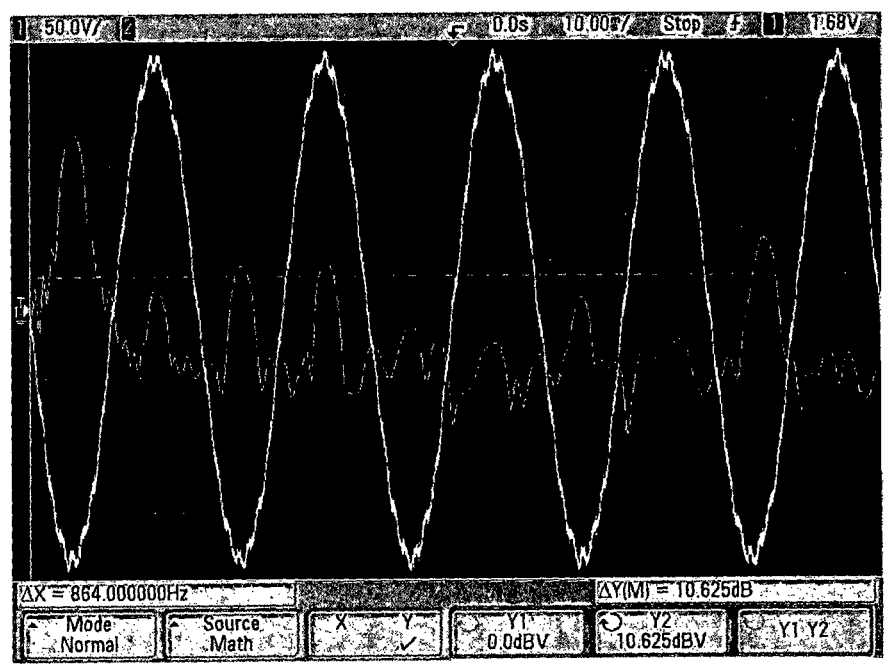
Figure 32:
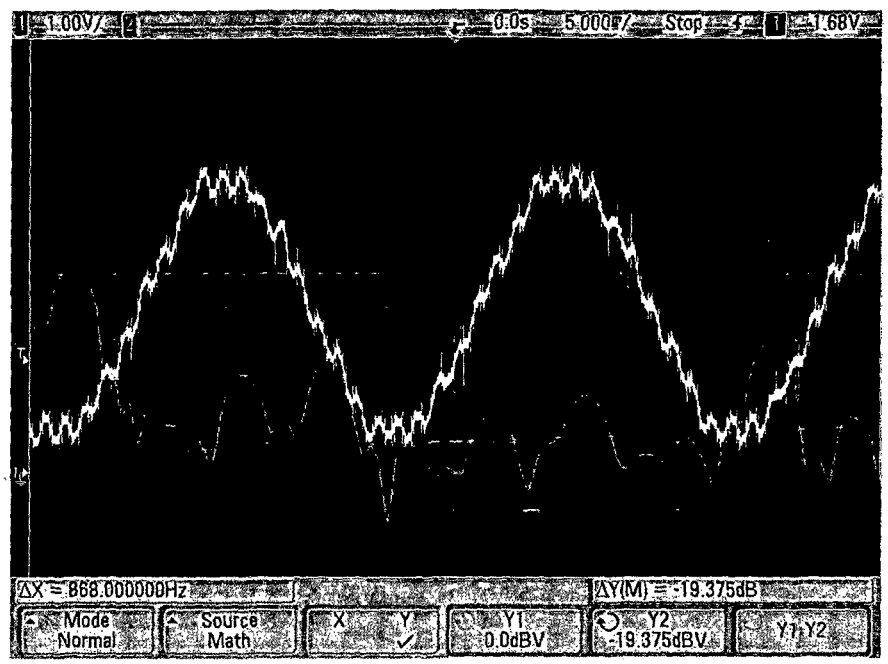
Figure 33:
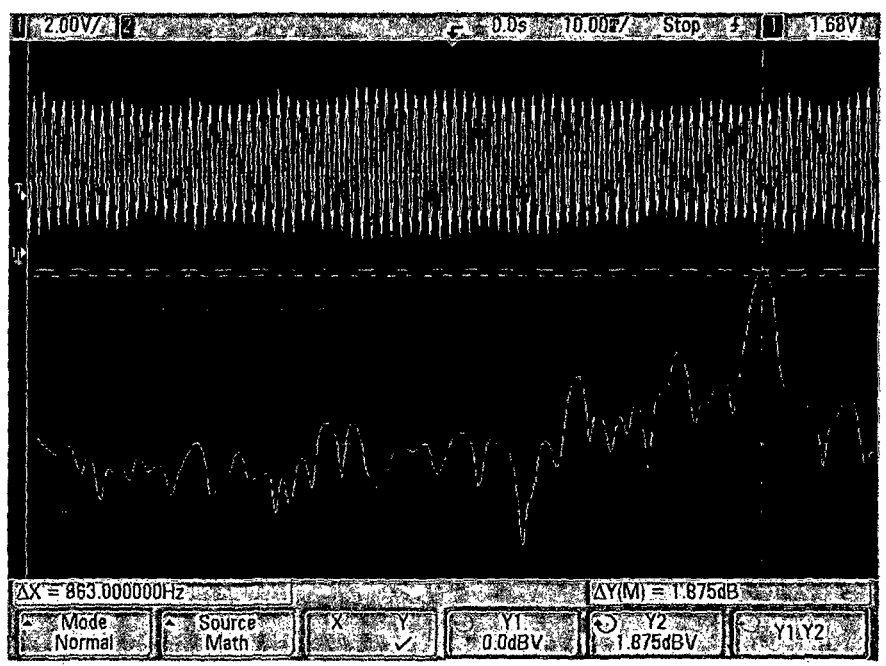
Figure 35:
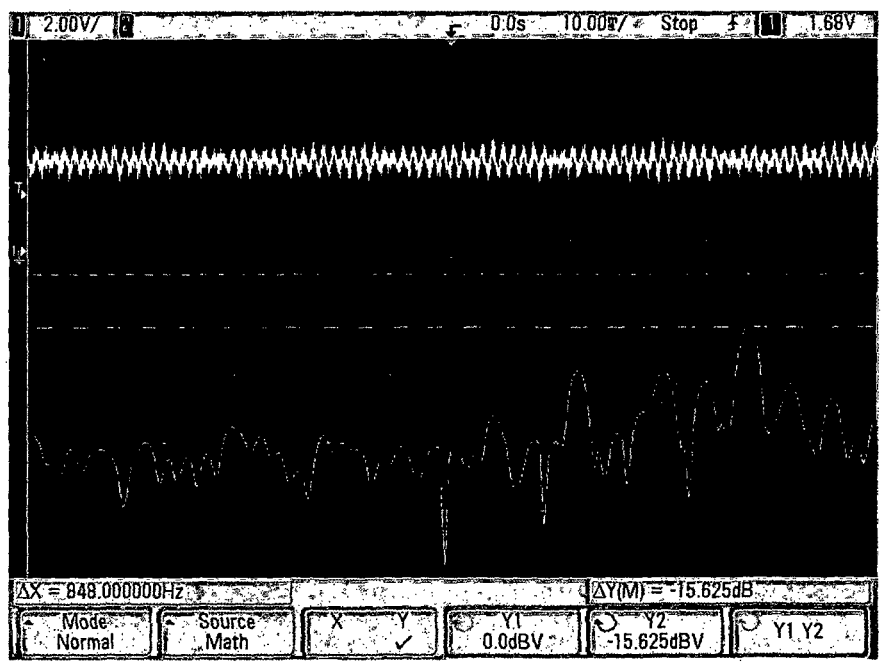
Figure 40:
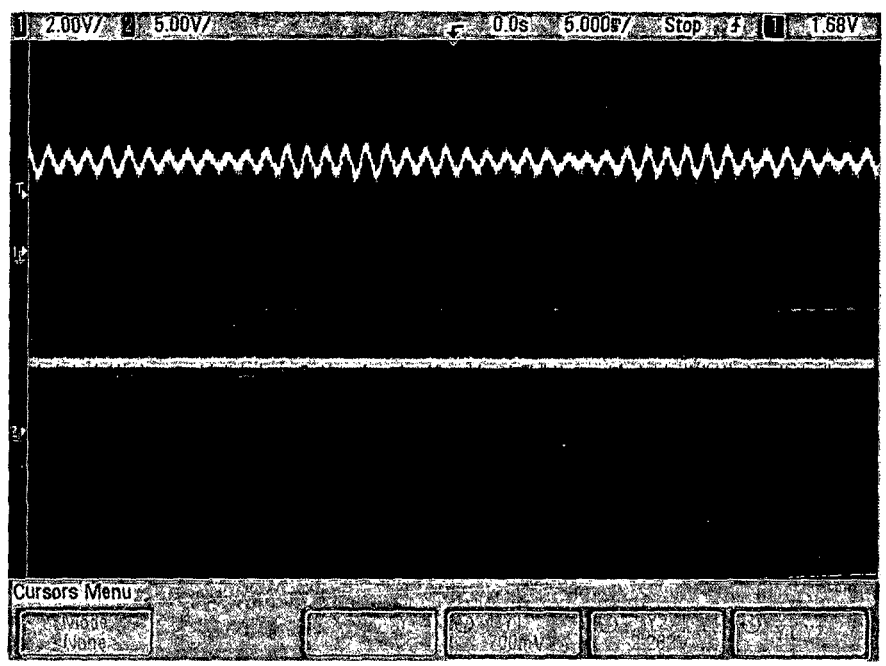
Figure 41:
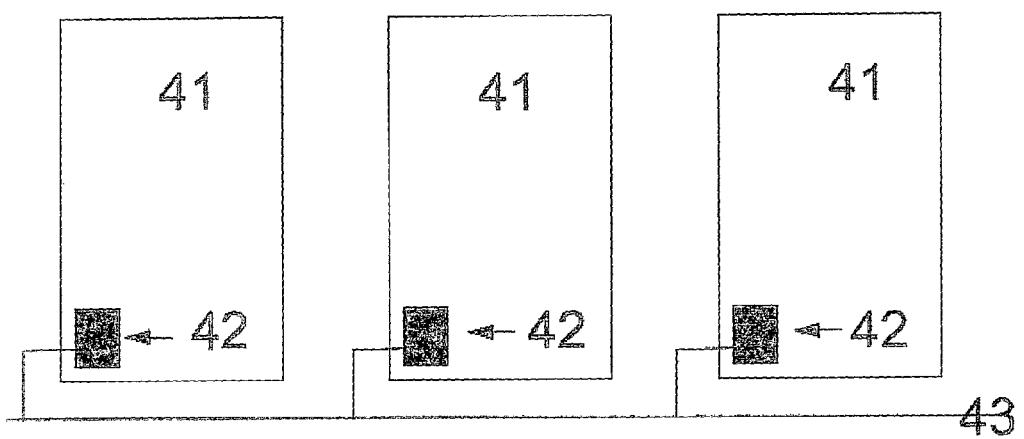

FIG. 28: shows a plot of measurements taken using simple 128 sample averaging;

FIG. 29: shows a plot of measurements taken using a weighted rolling buffer;

FIG. 30: shows a plot of measurements taken using a combination of 16 averaged data points and then 16 weighted rolling average points;

FIG. 31: shows the mains voltage in a practical LDC system;

FIG. 32: shows the high pass filter output of the system of FIG. 31;

FIG. 33, 34: show the band pass filter outputs for 710 Hz and 864 Hz respectively from the output of the high pass filter of FIG. 32;

FIG. 35: shows the output of the bandpass filter when the signal injection system is turned off;

FIG. 36-39: show the results of use of a schmidt trigger at 733 Hz, 800 Hz, 868 Hz and 710 Hz respectively;

FIG. 40: shows the output when there is no signal injection;

FIG. 41: shows a series of appliances connected to a system such as an islanded network in accordance with the invention.

DESCRIPTION OF ONE OR MORE EMBODIMENTS

A new approach to dynamic demand side control will now be described. In one embodiment this new approach allows the mains frequency to be constant and also allows for local Distributed Generation (DG), as shown in FIG. 3. This approach may be considered to be a form of distributed generation demand control, but for convenience this approach is referred to in this specification as Local Demand Control (LDC). In essence, a load in a power system comprising a selected group of loads and/or supplies (in one example an islanded system) that has a connection point to the grid is controlled to prevent the power supplied from the grid to the islanded system from substantially exceeding a set point. This control concept can also be used to control supply of power from the system to the grid.

The term "islanded system" is used in this document to refer to a power system or subsystem or network that may or may not include generation and which has at least one point of coupling to a utility supply grid. An islanded system may supply power to a plurality of consumers who use loads (for example domestic appliances), or possibly share a load, connected to the system. In one example an islanded system may comprise a single household, and in another example may comprise a city. In another example an islanded system can be defined by a number of households which are not necessarily located in the same immediate geographical area collectively agreeing to form an islanded system for the purposes of implementing the invention.

The loads of the islanded system may include any power drawing device, for example including household appliance, electric vehicle charging device, hot water heater. Loads may also be, or at certain times act as, sources, such loads include for example renewable energy generators, inverter outputs, battery banks or energy storage devices. Multiple loads may also be combined into groups, consisting of a variety of individual loads, so that the operation, control or monitoring of the loads can be linked. These grouped loads do not, necessarily, share a controller and may be connected to the islanded grid at one or more points. A group of loads may then be monitored against a set-point/reference different to that of the main islanded system.

One example of implementation that will be set forth below is that of an islanded system comprising a small community such as a farm or a small village. However, as noted above the system is also applicable on an even smaller scale, such as an individual dwelling. Similarly, the invention may be implemented on large scale islanded systems such as a city.

In the case of a farm for example, power is available from the grid 1 but it may be at the end of a long feeder that also drives other isolated farms, so that it is weak and highly variable. This single, or sometimes three-phase, feeder cannot drive large loads without disrupting the power supply to neighbours so the idea of charging one or more electric vehicles at perhaps 7 kW is not practical. In the example here the islanded system includes a generator, so power from the utility supply grid is available in addition to locally generated power. In this example the network or islanded system includes a generation in the form of a wind-turbine 2 which drives a single phase induction generator 3 to produce single phase power. Three phase power can also be generated. The power available on the farm is then the power from the utility feeder for example 15 kW, and the power from the wind-turbine which might be only 20 kW in a small application, and which varies widely as the wind strength varies.

A set point reference can be established for the power available from the utility feeder. Thus the set point represents a base power requirement for the network or islanded system supplied from the utility grid. The base power requirement may be established by the consumer(s) and/or by a load controller or a grid system operator, as discussed further below. The base power requirement, and thus the set point, may be varied. This may be dependent upon factors such as the power requirements of the islanded system, the cost structure for power supplied by the grid, and the overall power demand on the grid i.e. the power available to the islanded system from the grid. In one example, the system demand on the grid can be monitored and then the set point can be adjusted based on the demand trend when the next utility billing period begins. Thus if the utility bills in half hour periods, then the set point may be adjusted to coincide with the commencement of the next half hour period. The system may signal the intended change in set point to the grid system operator in advance of the change. In a second example the set point may react to the above factors and/or the conditions of the grid, including frequency, voltage or other electrical signal. Alternatively the set point may be transmitted independently of the grid, using wired or wireless communications including GPRS, Internet, or Wifi. This type of communications may be of particular use when the islanded system is not geographically connected. In this case it may be necessary to calculate the set-point at a set of points, or transformers, use this to calculate the control signal and then send the control signal to the load controllers, such as dongles (described further below), of the islanded system.

The available power is the sum of the set point power from the grid and the generation within the islanded system at any instant. A control signal which is indicative of the available power may be added in common to all the phase voltages of the local system from a system controller 5. The power transferred into the islanded system may be monitored compared with the set point to establish a differential power transfer, and this differential power transfer may be controlled by appropriate load control to average zero. The monitoring or measuring means may measure power at the, or each, connection to the grid, or elsewhere if desirable. The monitor or measuring means may relate the total power into, or out of the islanded system against the set point and generate an output signal. The output signal may constitute the control signal to be communicated to the load controllers; alternatively further processing of the output signal may occur before the control signal is created. The signal from the monitor or measuring means and/or the control signal may also be made available to independent devices to enable monitoring by other devices, users or providers. In one example the control signal may be used by a user to monitor the power in the islanded system or part of thereof. This may include storing the control signal and/or producing further data based on the control signal. In a second example the grid controller may wish to monitor the control signal, or power flows into/out of the system, either at a particular instance or over a period of time. In one embodiment there may be a monitor for the user which allows the control signal to be monitored and system characteristics, such as priority, of supply for various loads to be changed. Similarly, one embodiment provides the grid controller with a monitor of the control signal and enables the system characteristics such as base power requirement, to be changed. In one embodiment the control signal is derived by determining the energy transferred to the islanded system from the grid over and above the energy that would have been taken had the system operated continuously at the set point. This difference may be represented by a voltage, and used to generate a control signal as discussed further below.

Further detail is shown in FIGS. 12 to 14. The system controller 5 may produce a voltage from which a control signal is generated using a voltage to frequency converter 21. In this example the control signal is a simple tone e.g. 1 Volt varying from 200 Hz to 1 kHz, as shown in FIG. 13, corresponding to a "guaranteed" lower power limit to 20 kW for example. Each appliance 37 or household 9 for which the system is implemented is associated with a load controller, such as controller 30, which receives the common control signal described above from the network power transmission lines directly for example and controls the appliance or appliances 37 accordingly. The control of the appliance may include providing a defined response (on/off) for the load based on a feature of the control signal (including frequency of a simple tone or other electrical property). Each load being controlled may have a different response to the control signal, thus allowing a priority of loads to be implemented. Referring to FIG. 14, one example of a load controller implementation is shown in which the load controller 30 has filters 31 to 34 (and possibly more) that correspond to different load switching or operation priorities. A dongle 36 is provided connected between the controlled load, such as appliance 37, and the supply (in FIG. 14 represented by power outlet socket 35). Dongle 36 includes a switch to enable on/off or variable control and is responsive to an instruction from load controller 30 to increase or decrease the demand of the appliance 37, or other load, to which it is connected. The dongles may store information, or may be designed so that they react to the control signal only. It is possible to have a dongle in which the priorities may be changed, including through a physical device on the dongle or through some wired or wireless programming method. In one embodiment the dongles select an appropriate reaction based upon the frequency of the control signal received. Communication between the dongle 37 and the load controller may occur over a wireless network in one embodiment. As an alternative, the functionality of the controller may instead be included in dongle 36 so that separate controller hardware is unnecessary. The controller or dongle 36 may be provided as part of the appliance, so that separate hardware is unnecessary. Referring to FIG. 41 each appliance 41 has an included dongle 42 which receives the control signal 43 described above. An appliance 41 with an included dongle 42 may have modifications which make better it better suited to the local demand control (LDC) system. In one embodiment there may be multiple control signals used, with different loads, or groups of loads receiving and acting upon the different control signals.

Thus, any relevant appliance or electrical device will then turn on/off (or have its demand controlled variably if that is possible or appropriate for the given load type or function the load performs) as the control signal frequency varies in response to more or less power becoming available as the wind speed varies, and as other loads turn on or off. The control signal may also be a digital signal propagated by wire or wirelessly over the community supplied by the network. All the LDC compliant devices get the signal at substantially the same time and turn on/off appropriately. Therefore, the control signal is most effective transmitted by a low latency system. In FIG. 3 the control signal is shown as being generated at the local transformer of the utility grid. This is a convenient practical location for such a controller as it can measure the power supplied from the grid at this point. However it will be appreciated that the load controller could be located at another physical location, and may even be located remote from the islanded system. The control signal may be provided by means other than that described above. For example, a wireless communication system or network could be used. Thus the communication of the control signal may occur by varying the system frequency, by radio signals, by WiFi or Zigbee, or by Internet for example. For example, in a situation where the islanded system is not geographically connected a radio frequency signal or internet link, may provide the most effective communication means. In some systems it may be preferable to have multiple communication methods or control signals. The control signal may also be communicated to devices other than the controller, including other components of the system, or external monitors.

As mentioned above, each load may be designated a priority. The order of priority is whatever that community, or individual consumers in that community, want. Setting priorities should be considered carefully as devices at the high power end are likely to be turned on and off relatively often and some devices, for example refrigerators, are not rated for rapid switching. Devices which consume relatively low amounts of power can be put at the low power end of the priority list. Those for which frequent on/off switching is undesirable can include an operation schedule which prevents a switching action for a certain time period. For example a schedule for a certain load (such as a refrigerator) may include a schedule which requires that whenever that load is switched on/off it must stay on/off for at least 10 minutes or until it turns itself off.

This may also depend on other factors such as time of day or load condition for example. The priority for each appliance can be stored in each load controller in such a manner that it can be varied either by a user or varied intelligently by the load controller depending on parameters such as the function performed by the load. Alternatively the prioritisation of the loads may be implemented by adjusting the response of the controllers so that they operate to give the intended priority. In one example a higher priority load may require a larger frequency change than a low priority load. This method may not require any storage of priority information on the controller.

The consumer and/or the "community" in the network or islanded power system can decide on load prioritisation. For example in FIG. 3 each household is shown with a water heater load 6 and an electric vehicle (EV) charging load 7. If a consumer has chosen the EV load 7 to ordinarily have a lower priority than the water heater load 6, then load 7 will ordinarily be switched off in preference to load 6 as the control signal indicates that the available power supply is diminishing. However, the load controller may change the priority if it determines (or receives feedback indicating) that the EV charge is very low for example, or the water temperature is sufficient (even if it is not optimal), or dependent on the time of day (for example cutting water heating in the middle of the night in preference to vehicle charging and recommencing water heating at an appropriate time). Both loads 6 and 7 are of a type that can be controlled to be continuously variable, and the load controller may perform that function. It will be seen that the system of prioritisation described herein is applicable to DDC in general and is not necessarily limited to use in an islanded power system as the control signal that is used may be the frequency of the power system. It will be seen that "energy" loads, which are tolerant to power supply variability, such as water heating and EV charging can be prioritised so that the variable generation from the generator 3 is effectively used to supply those loads. Thus the invention can make good use of variable generation such as that from renewable sources including wind, solar and tidal generation sources, for example.

In the form described above with the wind-turbine driving an induction generator both the voltage and the frequency are set by the grid. The power taken from the grid can be reduced to zero and power can even be exported back to the grid if the power is not actually being used i.e. if all loads are being supplied as required. Indeed in larger applications the System Operator (SO) for the islanded system can ask for the grid power to be reduced, if possible, or a higher 'time of day' pricing schedule might be incurred. If there is a surplus that is not wanted by the SO it can be used for water heating or dumped. In one embodiment a set point reference can be established for the power delivered to the islanded system from the grid (the feeder in the farm example described above) and the controller can provide a control signal to the controllable loads so that the power delivered to the islanded system does not exceed, or at least does not substantially exceed) the set point. Furthermore, dependent on the nature of the loads supplied by the islanded system and the generating capacity in the islanded system, the islanded system may be managed so that the power delivered from the grid is substantially maintained at the set point, at least for certain time periods. In this way the demand placed on the grid is more predictable, with less unexpected change in demand, so spinning reserve can be lessened or at least be more economically managed by the grid operator.

In some systems, for example those with relatively low power usage and high generation capacity, the islanded system may operate to feed a substantially constant amount of power into the grid. The return of power to the grid may include occasions when generation is greater than the maximum load in the system, at times of high demand in the grid, at times of low demand in the islanded network or at times set by the LDC controller. In one example the set point could be adjusted to indicate that energy could be returned to the grid. In a second example, at times of high demand, the grid controller could request a change in the set point so that power is returned to the grid, with non priority loads turned off. In these systems the grid controller may be able to adjust the power drawn from multiple LDC systems to smooth out the load on the grid.

A significant feature is that fluctuations in the wind speed causing variations in the power being generated are essentially removed by the LDC controller so that if power is programmed to be sent back to the Grid then it will be high quality constant voltage grid frequency single phase or 3 phase which has a high value. However if power is sent back to the grid because there is insufficient load to absorb all of the power available it will be lower quality and consequently of lower value. In the event of a power cut this system cannot generate as the induction generators will have insufficient VAR excitation; this is by far the lowest cost implementation and also the safest as the local generation cannot enliven a line that the power company has turned off for whatever purpose. Where power continuity is essential, for example for a dialysis machine, UPS could be used.

A controller for this LDC system is shown diagrammatically in FIG. 4. It is similar to the controller shown in FIG. 2 except that the feedback path is now completely in the induction generator. In these circumstances the output $\Delta\omega$ is now a change in the slip frequency of the machine causing a torque feedback of $$\frac{\Delta\omega}{\omega_{s0}}T_0$$

where $\dot{\omega}_{S0}$ is the rated slip frequency of the induction machine and $T_0$ is the rated torque. This gives a transfer function $$\frac{\Delta\omega}{\Delta T} = \frac{\frac{\omega_{s0}}{T_0}}{1 + \frac{sJ\omega_{s0}}{T_0}}$$

This transfer function corresponds to a first order system with a short time constant so that the expected system response is fast with no overshoot.

A comparison between a conventional DDC controller and the LDC controller is shown in Table 1. The significant differences are that some embodiments of the LDC system need an extra communications feed to the LDC compliant devices, but it can run in a mixed power mode where power is taken from the grid and the wind turbine at the same time. The conventional DDC system is essentially a stand-alone system best implemented with a synchronous generator whereas LDC operates as an island in a grid system but with its own internal controller and is best implemented with an induction generator. Conventional DDC is responsible for its own frequency and voltage control whereas LDC takes its voltage and frequency from the grid but power can go in either direction and changing the direction of power flow is simple and seamless.

TABLE 1

A comparison between controllers

| Attribute | DDC | LDC |
| --- | --- | --- |
| Run Stand-alone | Yes | No |
| System frequency | Local control | Grid |
| Voltage regulation | Local control | Grid |
| Mixed Power Mode | No | Yes |
| Frequency range | 50 ± 0.2-0.5 Hz | Grid 50 ± 0.2 Hz |
| Response | $2^{nd}$ Order | $1^{st}$ Order |
| Damping factor | Inertia critical | Inertia not critical |
| Generator | Synchronous preferred | Asynchronous preferred |
| Switch to Grid Power | Complex system | Seamless |
| VAR controller needed | No | No |
| Phases | 1 or 3 | 1 or 3 |
| Response time | <1 second | <1 second |
| Cost | High | Lower |

The most significant difference between the machines and their controllers is possibly the inertial requirements. Wind machines are relatively low inertia and the LDC system can operate with low inertia. Conventional DDC systems need approximately 0.02 kg.m$^2$ of inertia for each 2 pole kW. Thus a 12 pole 1 kW machine needs 0.72 kg.m, and a 12 pole 100 kW machine therefore needs 72 kg.m$^2$. These inertias may be quite difficult to achieve but without them the damping of a conventional DDC controller may be poor. The LDC controller is helpful in this respect.

As mentioned with reference to FIG. 3, the invention also has application to Electric Vehicles (EV's), both for charging and roadway power requirements. Examples of EV inductive charging and inductive roadway use are described in our published pending applications WO008/140333 and WO2011/016736. Although these publications predominantly refer to inductive coupling of vehicles to a power system, it will be appreciated that the present invention may find application to either inductive or non-inductive coupling mechanisms.

Referring to FIG. 5, an EV which is charged inductively is shown. A stationary power supply 10 energises a track or pad 11 in or on a floor or roadway. The vehicle 12 has a pick-up coil 13 and the electric energy transferred to the pick-up is conditioned and provided as DC power for use with charging and/or operating the EV.

Referring now to FIG. 6, when EV's are in motion along the road 20 they can be powered inductively from an 'endless' string of pads 11 buried in the roadway. These pads are powered by power supplies 10 spaced perhaps 200 m apart and driving 100 m of roadway in each direction. As a vehicle moves along this road 20 the pad(s) 11 underneath it are energised synchronously with its motion providing a power wave that keeps the vehicle fully charged. Each pad produces an arched flux across the roadway that switches from pad to pad as the vehicle moves. The vehicle is powered at 10-20 kW depending on whether one pad or two is providing linking flux and this power is sufficient to power the vehicle and keep the battery fully charged. Each 100 m section may or may not have a vehicle on it—if there is no vehicle then this section switches off. Conversely each section may have 5 cars at 20 kW each with 20 m spacing between the vehicles. If there are more vehicles then the section is overloaded and a DDC system is used to reduce the power to each vehicle so that the system does not collapse. The power supplies 10 provide an IPT frequency of 20 kHz; this 20 kHz is varied between 19.9 and 20.1 kHz to indicate the loaded condition of the section—at 20.1 kHz the vehicles take full power, at 19.9 kHz they take reduced power in a classical DDC situation. These sections of roadway could be driven from a mains supply or from local wind or other 'green' sources. Thus these systems may comprise islanded power systems to which the invention is applicable. Overloaded sections trigger a signal 'congestion—increase spaces between vehicles' to the driver. The introduction of LDC on an islanded system composed of a series of inductive charging pads may allow for local control of the power drawn from the grid and removes the need for frequency variation of the grid system. In one example an islanded system consisting of a set of inductive charging pads, and possibly including energy generation, could monitor traffic levels, power usage and power cost to balance the needs of the system.

Similar applications—though a lot simpler—will exist in car park buildings that offer parking and charging. Here one power supply 10 can drive many pads 11 and charge many vehicles at the same time to give a simpler arrangement than one power supply and pad per parking space as in a garage or parking place at home.

Measurements and Simulations

1. Simulation of a Battery Charger with DDC and IPT Coupling

A classical DDC controller has been tested under laboratory conditions and by computer simulation. In the laboratory a controlled AC drive in a torque controlled mode generated a string of random torques changing each second. The AC drive (variable speed induction motor) was connected to a 3 phase alternator generating at 50 Hz. Two of the phases were on resistive loads, and the third phase was passed to a DDC controller set up to charge an electric vehicle battery at 300 V DC. The measured and computer simulated outputs are shown in FIG. 7. The system was controlled by the DDC controller at 1000 rpm with a 4 pole induction motor and a 6-pole alternator. A huge advantage of this experimental set-up is that the same random sequence can be used for all of the tests.

The first graph 7 (a) shows the random torque signal used. The second graph 7 (b) shows the generator frequency (equivalent to shaft speed) with and without DDC control, and the third graph shows the current into the battery (with DDC control). Since from graph 7 (b) the speed with DDC is essentially constant the power input is a scaled version of the first graph and the power output, with a constant voltage battery, is a scaled copy of the battery current. Thus ideally graphs 7 (a) and 7 (c) should be the same—the correlation between them is exceptionally good showing the accuracy of the DDC controller. The $4^{th}$ graph 7 (b) shows a simulation on Simulink™ for the expected battery current from the circuit. It is a close fit to the measured data with the same average current and slightly less variation showing that the inertia figures for the experiment and the simulation are not quite identical.

2. Simulation of the Power Used in a Small Community

An LDC system can be used in many circumstances wherever there is a community of common interest. Perhaps the simplest is a 400/230 V distribution transformer where all the consumers on the transformer form the LDC system. Here there is no wind power but the transformer load may be monitored and the connected houses switch LDC compliant loads so that the total load of all the houses is managed. In this way the load presented by this transformer to the 11 kV feeder is almost constant. The transformer operates at a higher load factor and problems of residential infilling are greatly reduced. Also the electronics can monitor the supply frequency and if it is too low it can drop all non-essential loads, and if it is too high it can switch on all possible loads.

Here in a slightly more complex situation the power demand for a small community comprising twenty houses containing LDC compliant loads and EV IPT charging pads has been performed where mains power to a nominal maximum amount of 20 kW (1 kW/house) is included. Wind power is added as a random sequence, changing every ten seconds, with an average value of 70 kW. The load taken by each household averages 3.5 kW, but can peak at up to 7 kW. This system therefore includes 77% wind which is very high.

Central to the system is the LDC controller which measures power flow to the grid and compares this with a known limit or set point reference. This set point may be set manually or provided to the LDC controller from the grid through wired or wireless communication or through some electrical characteristic of the grid power. A simple integral controller may then be used to determine the difference between the energy supplied to the islanded system compared to the energy that would be transferred if power were being supplied at the set point and uses this to produce a differential power signal which is provided to the system as a power priority signal that varies from 0 to 10 in real time. The most important device is priority 1, whilst the least is priority 10. Consequently, devices with priorities below the signal will stay on whilst those above will be switched off. Different devices and/or dongles may react differently to control signals, with the difference possibly dependent on the type of load or source being controlled. The control is thus implemented so that the differential power, i.e. the difference between the power supplied from the grid and the set point power reference is substantially zero on average. In one embodiment it may be desirable to measure the energy, or time averaged energy.

Each house consists of a number of LDC controlled loads. These are listed in Table 2.

TABLE 2

Simulated loads in each household

| Load | Average Power | Peak Power | Priority |
|---|---|---|---|
| EV Charger | 2 kW | 4 kW | 4-10 |
| HWC | 500 W | 2 kW | 4-9 |
| Refrigerator | 60 W | 250 W | 1-6 |
| Base Loads (x4) | 250 W | 250 W | 1, 2, 3, 4 |

All loads except the base loads are assumed to vary linearly over their given priority range, consuming minimum power at a lower priority signal. The four 250 W base loads are simply switched off if the signal goes below their given priority. A small random offset is given to each of these so that not all houses' base loads of equal priority switch at exactly the same time.

An example of the simulation output is shown in FIG. 8. It can be seen that the wind varies significantly but the load on the system is kept in step with this varying wind. The power drawn from the grid is regulated to 20 kW. The probability density functions for the power taken from the grid and the power generated from the wind are shown in FIG. 9. The left plot shows the power supplied from the grid and gives an idea of regulating efficiency. The right plot gives an idea of the range of the power output from the wind turbine. Note that the grid power is almost constant at 20 kW with deviations caused by loads switching on and off. The wind power is a roughly Gaussian distribution with a wide standard deviation—the ideal result would perhaps be a Weibull distribution p(x) where x is the wind speed, modified to $x^3$ to represent the power output demand in approximately one second.

FIG. 10 shows the power usage over 1 hour for a single house. Here the power taken is quite volatile but when combined with all the other houses the % variation can be improved considerably. It can be seen that the fridge and hot water cylinder modulate their switching times to coarsely adjust demand, while the EV charger fills in the gaps. In this way a large load with continuously variable control is seen to be important to the controller strategy.

The response of the system to a step in wind is shown in FIG. 11. The system adds 20 kW of demand in about three seconds in a predictable first order response with no overshoot. It can be observed that this response is made of steps in load and more continuously variable load as a function of time. The smaller loads are simply switched on and off depending on the availability of power while the larger EV and water heating loads are continuously variable and take power depending on the amount of power available making the overall response more linear.

FIG. 15 shows another example of the layout and information flows in a fully LDC island which includes generation, distribution and a number of houses all with LDC controllers. Here each LDC controller outputs a signal based on both the signal from the parent node and the power throughput measured locally, that is, the "set point" of the system controller of the islanded system can be varied, possibly continuously, based on information from the grid which indicates the total load on the grid. While deploying LDC network wide would be a significant task, the system works just as well in isolation. A hybrid of DDC and LDC would also be very easy to implement and is shown in FIG. 16.

In FIG. 16 generators so supply loads 52 and 53, and generator 54 supplies loads 53. The system frequency is used as the signal to LDC controllers built into transformers (not shown). The LDC controller then takes this into account when calculating the control signal for subsequent devices running off that transformer. In this way, the LDC system would help balance both overall supply and demand with DDC and manage local constraints with LDC.

In general usage of DDC and LDC can be categorised into three main usage scenarios based mainly on size as shown in Table 3. As DDC requires allowing the frequency to vary, it is most useful in islanded grids. These could be large systems such as the North Island of New Zealand or small isolated systems such as remote villages. Alternatively, LDC is suitable in mid-size systems where the frequency may not be allowed to vary or may not represent the generation constraints of the grid. A community with local wind generation is a good example of this.

TABLE 3

DDC USAGE SCENARIOS

| Type | Example | Constraint | Possible Signal | Operating Goal |
|---|---|---|---|---|
| Grid wide (DDC) | North Island | Total generation | Grid frequency | Balance supply and demand |
| Localised (LDC) | Single street, Farm community | Transformer, Grid interconnect | Local tone or similar | Keep within ratings |
| Isolated (DDC) | Island village | Local generation | Grid frequency | Fully utilise renewable source |

Depending on what transmission method is used to transmit the control signal, transport delays and sampling of the LDC control signal may be unavoidable. This could be introduced by analogue filtering or using digital communication.

In order to quantify the effects of latency and sampling of the LDC control signal, a modified version of the simulation mentioned above was run. The simulation was run for 15 minutes with a square-wave modulated wind turbine output. The turbine output changes between 20 kW and 40 kW four times during the simulation as shown in FIG. 17. Two separate tests were done. In the first, an analogue delay was introduced that varied between 0 s and 1 s.

In the second test a sample and hold was added to the priority signal, with the sampling period also varying between 0 s and 1 s. In each, the system performance was measured with each change in delay or sampling rate.

As the LDC controller is trying to regulate the grid interconnect power to a specific level, the variation is a good measure of how well the LDC system is performing. In order to get the best performance from the LDC controller, the integrator gain was modified with each change in delay or sample time in order to avoid overshoots or oscillations caused by the transitions. The results of both tests are shown in FIG. 18.

It can be seen that the ability of the LDC system to regulate power consumption is almost linearly related to any transport delay or sampling in the system. For this reason, the LDC signal needs to be transmitted as fast as possible in order to get maximum performance. A delay of between 0.1 and 0.2 seconds is a realistic goal and this still yields good performance. It can also be seen that sampling rate has less effect on system performance than transport delay. A sampling period of <100 ms (>10 Hz) is sufficient for a good performing system. These figures put limitations on the size of a network that might be served by a LDC controller in real-time. DDC is appropriate for levels up to grid scale but LDC may be best restricted to small islands within that DDC grid.

The basic circuitry required for the LDC controller functionality can be described with reference to a system that in one embodiment includes a wattmeter and Modulator, Dongles, and a House Controller. These are discussed in more detail below.

1. Wattmeter and Modulator.

Quantity: 1 per system

Location: ideally (but not necessarily) near the point of common coupling to the grid.

Power requirements: self powered

Inputs: 3-phase 3 wire mains supply

Output: Single turn coupling to the neutral wire on the output 3 phase 4 wire system before the neutral wire is earthed.

Description:

Conceptually this device measures the power taken from the 3-phase 3-wire mains supply and gives an isolated output. For an experimental version the input is 3 phase, 400 V, 50 Hz, current 3-4 A. Output scaled 0-3 kW equals 0-3 volts.

Included with the device should be a set point input of for example 0-3 Volts=0-3 kW and an integrator that can take the integral of the voltage difference between the wattmeter and the set point with an output scaled to be 0-10 V. This 0-10 V signal is to be used to control a V to F converter working over a range between approximately $300\text{-}1200_{Hz}$, for example the range 0 V=600 Hz, 10 V=1,000 Hz which signal is then used to produce a 1 V signal on the neutral wire of the 3 phase system. The 1 V signal will be injected on to the neutral wire using a small inverter and a 100:1 transformer. Ideally the waveform should be a sine-wave but a square wave could be acceptable.

In a first Laboratory scale prototype all of these functions except the injection of the 1 V signal (the Modulator) on to the neutral are included in a prototype microprocessor controlled instrument. This device measures the power in each of the 3 phases (rated 230 v 10 A per phase), adds the three outputs, compares with a set point, and outputs a square wave with the correct characteristics for modulating on to the neutral wire. This particular Laboratory scale system is not suitable for scaling up to a larger 250 kW system.

2. Dongles

Quantity: one per Appliance

As described earlier in this document, Dongles are devices that sit in the power line between the switchboard on the house and the appliances in the house. Ideally they would be built into the appliance (i.e. the load), shown in FIG. 41 in which dongles 42 are provided in appliances 42 and are connected to the electricity supply line 43. In a second embodiment the dongles 42 could be connected directly between an electricity outlet and the or each appliance. A Dongle connected to an appliance may include appliance specific features. The dongle consists of a means of detecting the control signal and a means to respond to the control signal for the range of a parameter. The response will vary, including simple on/off switching to continuously varying loads. Some dongles may allow reprogramming of their response to the signal. This reprogramming could consist of a physical selection switch or mechanism or could be controlled by wired or wireless communication with another device, such as a computer. The Dongle makes the appliance LDC compliant so that it can operate in the manner required. There are in principle four types of dongles:

Type A: Simple on/off type. The Dongle isolates the control signal on the neutral wire and switches on at a fixed frequency and off at a lower frequency. For example the Dongle may switch on at 720 Hz and off at 660 Hz. Below 660 Hz the Dongle is always off, above 720 Hz it is always on, and between these two frequencies it is bistable and its state depends on the past history in the extant application.

Type B: On/off with minimum switching periods. This type of Dongle is suitable for motorized devices like a fridge or freezer where the number and/or frequency of switching events must be controlled. Here the device acts like a Type A Dongle but when it is switched on it must stay on for some minimum period—eg 10 minutes, and when it is switched off it must stay off for a minimum period—eg 20 minutes.

Type C: This Dongle is fully proportionally controlled. If the control frequency is 750 Hz or below the Dongle is off, if it is 850 Hz or above the Dongle is on, and between these two extremes the maximum output allowed varies linearly proportional to the frequency. The Appliance must be rated for this type of application. A good application is heat pumps or EV battery chargers.

Type D: This Dongle is similar to Type C but it is not continuously variable but has say eight separate states. The control frequency 750-850 Hz is divided into eight regions and these correspond to the operating states. In the lowest region the device is on at $1/8^{th}$ of full power, in the next region it is on at $2/8^{ths}$ of full power, and so on. To achieve this requires a compliant resistive load switching integral cycles in a random sequence to give the correct power output.

3. Dongle Applications

There are two alternatives to the way that Dongles may be used in a House. For example.

3.1 Alternative 1: Non-intelligent Dongles

With this alternative every appliance has its own Dongle which decodes all its own information. As outlined above the availability of power is encoded on to the neutral wire by a 1-2 V signal that varies from 750 Hz (no power available for priority loads) to 850 Hz (ample power available) on top of the mains voltage. The Dongles filter out this signal and use it to switch devices on and off, or vary them continuously by switching on mains zero crossings, according to the type of Dongle used—Type A to D. Here all the appliances/controllable loads are in a strict priority sequence or order and are switched on and off when activated by the control signal. For example essential loads are active at all times (if not switched off) and do not have a Dongle, high priority loads might be set to be active for a control signal in the range 750-850 Hz, and low priority loads might be active if the signal frequency is above perhaps 820-850 Hz. These trip points will vary with each Dongle but will be set at the time of installation. The trip points will have some hysteresis—for example a Dongle may switch on at 820 Hz and switch off at 780 Hz and both of these points are set at the time of installation. Dongles type C and D are also active all the time taking power proportionally to the control frequency.

Power: Self powered
Signals: 1-2 V 750-850 Hz,
Software programming: small
Measurement capability: none
Programmability: very limited

3.2 Alternative 2: Intelligent Dongles

This alternative has electronic circuitry—a house controller (HC)—that is preferably, but not necessarily, located in the meter box. It has the capability to decode the modulated signal on the neutral wire and know what devices are on/off and it can communicate with all the Dongles. It can also measure the power flow into the house (essentially Amps) but the flow of power to the Dongles and the appliances is unchanged. Communications to the appliances by the HC are for example by WLAN at 2.4 GHz or other, and, as before each appliance has its own Dongle but now each Dongle has its own WLAN transceiver. The HC is able to reprogram the Dongles on-line so that the priority order of every appliance is continually changing and only the default setting is set at the time of installation. Each appliance will be able to report on/off information and load current back to the house Driver. The Dongles will be able to operate as all four Types as above—in on/off modes with or without delays, or in proportional control modes as instructed by the HC. The type selection can be done in real time. As before small devices will be controlled using on/off switching on zero crossings to reduce RFI, while larger ones—hot water heater, heat pump, electric clothes drier, and electric vehicle charger will operate in a continuously variable way to give continuously variable control as described above for Type C and D Dongles. The Dongles will continually update themselves in response to the extant circumstances so that the power available is always used in an optimal fashion—for example if a high priority device is physically switched off the power slot that it was taking—say 660-720 Hz will be dynamically re-allocated i.e. the priority for that load has effectively been reassigned.

The intelligent dongles can act interactively with the appliances and the HC over the WLAN network. For example they may sense a characteristic such as a power requirement of the load being supplied, so with an EV battery charging load the HC can be aware of the state of charge and act so that the battery is fully charged by some specific time. Similarly if a drier is being used the 'dryness' of the clothes may be managed so that they are dry when required. Options like this will incur a higher price for the electricity but add to the versatility of the total system.

Power: self powered from 230 V 50 Hz
Signal: WLAN 2.4 GHz bi-directional, 1-2 V 750-850 Hz on the neutral wire.
Software programming: significant to achieve full potential.
Measurement capability: comprehensive
Fault reporting: comprehensive The invention may be implemented to allow a large number of households to be incorporated into an islanded system and be able to prioritise loads without any impediment to individual households setting their own priorities. A straightforward controller is used to determine when those loads can be switched on and when they must be switched off. There are clear advantages in having the largest loads—EV and hot water—with continuously variable outputs so that they are essentially available at all times to fill in the gaps between the switching on and off of other loads. Thus, the invention allows EV's to be charged as a LDC compliant load and this extends to the operation of those EV's in an electrified roadway situation. In a wind-powered system a community can get great benefit by having a wind turbine with a very large penetration. Excess power can still be exported to the grid but the total load on the grid can be managed within narrow limits in most circumstances. This same load management also extends to interest groups with isolated transformers in a city.

In another embodiment of the invention the system controller does not continuously transmit a signal, but instead the load controllers poll the system controller (or the measuring means directly) for updated information. In this case the information received by one load controller may differ from that received by another, for example if there has been a change to the power draw on the grid between one load controller requesting information and the next one doing so, or if the system controller adds a unique identifier to the data sent to a particular load controller. Such systems may be less desirable than those described above due to the potential to introduce additional latency into the system.

In some embodiments the islanded system may have more than one point of coupling to the grid, each point of coupling associated with a means for measuring the power drawn from the grid through the coupling. The control of the load controllers in the islanded system may be based on an aggregate or average of the power measurement readings. In a variant of this embodiment, the different points of coupling may be associated with separate islanded systems whose occupants have agreed to co-operate such that their combined power usage is compared to a set point.

Another example of a simple LDC system with power feedback and controllable load is shown in block diagram form in FIG. 19. The symbols used are described in the table below:

| Symbol | Definition |
| --- | --- |
| ΔP | Input power |
| $P_s$ | Power imbalance |
| T | Integration time constant that converts kW to kWh |
| $L_{DC}$ | Energy imbalance signal distributed to loads |
| k | Conversion constant between energy imbalance and power |
| $T_1$ | Filter time constant |

Since here the system power is being regulated, the output of the system is $P_s$. The input is the power disturbance which is the difference between the set point and the power that the local system is consuming—ΔP.

This results in a transfer function of $$\frac{P_s}{\Delta P} = 1 - \frac{k}{s^2 TT_1 + sT + k}$$

Here the damping ratio is also:

$$\zeta = \frac{1}{2}\sqrt{\frac{T}{kT_1}}$$

Again this means the performance of the system is dependent on the integral time constant, filtering constant and available controllable load. As mentioned earlier in this document, an important difference between this response and that for DDC is that the system inertia is not involved. In fact the inertia of the grid makes the whole network stable without having to add extra. As far as the controller is concerned the damping factor and hence the stability is dependent on the controller gain and the integrator time constant and these are easily adjusted. This transfer function is the expected result as any instantaneous change in ΔP will be directly seen at $P_s$, hence the "1" in the transfer function. This will then be followed by a second order response as $P_s \rightarrow 0$ given by the second term in the transfer function.

It can be observed from the system diagrams of both DDC and LDC that they have the exact same structure. Since DDC is regulating Δω and LDC is regulating $P_s$, the outputs are different but the underlying transfer functions are still the same. The huge advantage of LDC is that in addition to the filtering constants k and $T_1$ being configurable, the integral constant T can also be changed without affecting the mechanical machines. This means the speed of response and the stability are not dependant on any physical properties of the system as it is in DDC. However, as mentioned above, the disadvantage of LDC is that the control signal $L_{DC}$ has to be distributed over the network accurately, without corruption, and with low latency. With DDC this is not a problem as the system frequency is everywhere the same but here it is more difficult.

In a practical grid environment, a demand response system should be able to react in less than a second to any appropriate signals or disturbances. This requirement is often specified by the system operator. The only physical constraint in an LDC system is delays in generating, distributing, filtering and responding to the LDC signal. The time constant of the filter is designed to dominate any other delays such that the operation of the system is predictable and stable. As is demonstrated later, a filtering time constant of T=0.1 is realistic.

The integral constant T can then be designed to give an ideal response for a given amount of controllable load k as follows:

$$T = 4\zeta^2 kT_1$$

For example, if there is 1 kW of controllable load (k=1000), the filtering time constant is $T_1$=0.1 and a damping ratio of ζ=0.8 is desired, an integral constant of T=256 will result. This gives a settling time to within 5% of approximately 0.6 s, which is well within the 1 s usually prescribed by system operators.

The operation of another embodiment of an LDC system can be explained with reference to FIG. 20. In that FIG. 3 phase power from a grid is measured by a wattmeter and then drives a local grid that can have transformers on it with multiple housing loads, and generators—shown here as a wind-turbine. The household loads are on a 4-wire system but generators are on a 3 wire or 4 wire connection as appropriate. The input 3-phase power is measured and compared with a grid reference set point. The result of this comparison is integrated and converted to a frequency control signal that is inductively coupled into the connection between the transformer star point and the earthed neutral. All the houses are fed from one or more phases and the phase-neutral voltage that they receive has the frequency signal with it. Inside the house there are dongles between wall plugs and appliances and these dongles are sensitive to the low power frequency signal and switch on or off or linearly control the appliance load as may be appropriate. The load may be controlled with a triac or other bi-directional switch as required. The household loads may also be prioritised (as described elsewhere in this document) such that as the availability of power increases and decreases the loads switch on and off according to their assigned priorities. The priorities may be fixed or variable and even dynamically variable and may be reassigned as the user requires as often as required—without limit. These options are shown schematically in FIG. 20 (d) with fu and fl designating upper and lower frequencies for a given priority. The frequencies are detected by detector 60 to enable latch 61 and gate driver 62 to trigger triac 63 and thus turn the load on or off (FIG. 20C). The controller of FIG. 20 (c) can be provided in dongle 64 between the appliance 65 (i.e. the load) and the power point 66. In one example (shown in FIG. 20(a)) the control system is added to an existing transformer, this may require the addition of a communications system to receive the set-point information and the output of a signal, or the LDC control signal, to be communicated to the control signal generator. In a second example the control system could be built in to a transformer. In a third example the control system, transformer and control signal generator may be combined in a single device.

The control signal, possibly a V to f signal created by the control system, must be small but capable of spreading through the local network. In one embodiment an inverter is used to produce a 2-3 V signal capable of 100 A or more e.g. a range of 50-500 A so that the signal does not get lost in the network. This signal is inductively couple to the neutral line between the star transformer and the phase-neutral voltage or ground. This means of placing the control signal on the neutral wire enables fast communications and reduces the possibility of a break in transmission. The control signal can control a range of different loads, including digital loads, linearly variable loads or any other type of load as required. The control signal must be recoverable in all the dongles on the network in real time so that the LDC control action can be implemented accurately, without delay to keep the network stable. To do this requires low cost easily constructed filters that can fit into appliances while taking little space and little power. These dongles require a special filtering capability as described below.

An analogue communication system has been designed in order to simply distribute the LDC signal around a micro-grid. This design requires the signal be unidirectional, of medium resolution (<8 bits) and have very low latency. A system whereby an 800 Hz tone is injected at the star point of the local distribution transformer and picked up and filtered at each load has been created. This tone is varied by ±50 Hz in order to represent the maximum and minimum LDC signal value. If the tone is at 750 Hz or below all dongle loads are switched off, if it is at 850 Hz or above all user loads may be switched on, and between these two extremes loads can be switched in a priority sequence.

As shown in FIG. 20(a), power supplied to a network may be measured by wattmeter 71. The difference between the measurement and the set point or reference is integrated by integrator 72 and a voltage to frequency converter 73 for example can be used to produce a control signal having a frequency dependent on the power available. To inject an 800 Hz tone at the star point of the transformer, an inverter and a transformer together generally referenced 74 are used in this embodiment. The inverter consists of a 3-phase rectifier, DC Bus, H-Bridge and a 100:1 transformer for isolation and some output filtering. The signal is small to the point where it has no effect on electrical loads.

One side of the injection transformer secondary is connected to neutral/ground (or earth) of the network being supplied and the other to the star point of the local transformer. In this way the 800 Hz tone can be picked up at any outlet within the system. The frequency of 800 Hz is in between the $15^{th}$ and $17^{th}$ harmonic of the mains, is far enough away from 50 Hz to be filtered and yet is low enough to still propagate well through standard wiring. It can be seen that with the Delta-Star transformer used the tone is a common mode and cannot propagate to the delta side of the transformer. Thus all local islanded systems or networks connected to the same grid are independently controlled and there is no leakage from one network to another.

This filter design requires that each controllable load has circuitry for filtering the 800 Hz signal added to the 50 Hz mains network supply. The inverter drives a 100:1 transformer and runs off the same voltage source as the distribution transformer. Given that the inverter input is rectified, there will initially be a 43 dB (100√2) difference between the mains (50 Hz) and LDC signal (800 Hz). To reliably pick up this LDC signal, the filter needs to have a relative gain of significantly greater than 43 dB in order to be reliable.

There are numerous filtering designs that could be used to provide this level of performance, passive networks, active filters and digital filters were all considered. In this example a design uses a combination of a passive filtering network and a digital filter inside a PSOC. An RC high-pass filter (HPF) is used to step down and bias the input signal about 2.5V in order to be accepted by the PSOC. This has the added benefit of attenuating the mains component significantly more than the LDC component.

The input is first stepped down using a 1:10 resistor divider to a voltage level of <30V in order to be suitable for standard capacitors. An RC network is then used step down again to a 5V P-P signal.

The RC HPF uses R=5k, C=68 nF and has a transfer function of:

$$\frac{V_0}{V_I} = \frac{s}{s + \frac{1}{RC}}$$

An attenuation of −4.0 dB at 800 Hz and 20.3 dB at 50 Hz is achieved which gives a 16.3 dB relative gain at 800 Hz.

This signal is then suitable for processing with a bandpass filter built from functional blocks inherent in a PSoC microcontroller. The filter is designed with a centre frequency of nearly 800 Hz and a bandwidth of 100 Hz. An exact frequency may be difficult to achieve depending on the PSoC frequency of operation and the division cycles that are available in the processor. The PSoC has the option of both a two-pole and a four-pole filter. A four-pole filter is achieved by chaining two two-pole filter stages together.

The transfer function of a two-pole filter is as follows:

$$\frac{V_0}{V_I} = \frac{G\frac{\omega}{Q}s}{s^2 + \frac{\omega}{Q}s + \omega^2}$$

For ω=800 and Q=11, a relative gain of 17.8 dB is achieved, bringing the total differential gain between the 800 Hz signal and the mains voltage to 34.1 dB. If a second two-pole filter is used there is another 17.8 dB which gives a total of 51.9 dB. This shows that a four pole filter is required in order to reliably differentiate between the two signals. This will give a total of 8.9 dB signal to noise ratio given an initial ratio of −43 dB.

As noted above, the band pass filter is realised inside a PSOC microcontroller, which places constraints on which values can be chosen. Using the PSOC Designer software, it was found that the following numbers were possible for a nominal desired 800 Hz centre frequency and 100 Hz bandwidth:

Filter centre frequency: ω=780 Hz
First pole: Q=11.491, G=6.4
Second pole: Q=11.205, G=7.111

The transfer functions mentioned previously were realised in MATLAB/Simulink in order to further verify the design. The input signal containing both the 50 Hz mains and 800 Hz LDC signal is shown FIG. 21. It can be seen that the 800 Hz signal is barely noticeable on the outline of the mains waveform, with small peaks and troughs just visible on close inspection. A frequency spectrum of this input is shown in FIG. 22. The main signal components are of course the 50 Hz mains and the 800 Hz LDC signal. It can be seen that there is around −42 dB of relative gain between the mains and LDC.

The high pass filter output shown in FIG. 23 brings this relative gain to around −22 dB. This is larger than, but in line with, what was calculated previously. The band pass filter then lifts this 800 Hz signal to +60 dB, as shown in FIG. 24. Again this is larger than that calculated but not too dissimilar. These simulations show the filter performance should be at least equal to, if not better than that calculated manually.

While demonstrating correct performance in a perfect environment is one thing, determining that the system will work in a non-ideal environment is also important. To this end, wide band noise was added to the simulation. To measure the exact output frequency, componentry similar to that which could be implemented in a microcontroller was used. The final band pass filter output is put through a Schmidt trigger to create a digital signal which can then be timed and filtered.

Multiple software filters were tested in order to find the most suitable method. With zero noise as shown above, the frequency measured is a perfect 750 Hz. Measurements were taken with noise at ~$3V_{RMS}$ and at ~$10V_{RMS}$. FIG. 25 shows the input spectrum with noise of ~$3V_{RMS}$. FIG. 26 shows the output spectrum noise of ~$3V_{RMS}$.

Clearly the 750 Hz signal is significantly higher in magnitude than the system noise, and should still be measureable. When the raw measurement output is plotted, the output is somewhat stochastic as shown in FIG. 27. This signal has a mean of 750.078 Hz and a standard deviation of 5.2848 Hz.

Using simple 128 sample averaging, a more stable result is generated and is shown in FIG. 28. Here the mean is 750.003 and standard deviation 0.1008 Hz. 128 sample points were used as this generates a new data point every 0.16 seconds. This is close to 0.1 and therefore on the order of the desired filtering delay.

Using a weighted rolling buffer of the same length gives a mean of 749.997 Hz and a standard deviation of 0.0797 Hz. This has a lower overall delay and narrower spread than the standard averaging method and the result is shown in FIG. 29.

Using a combination of 16 averaged data points and then 16 weighted rolling average points gives a better result, achieving a mean of 749.999 Hz and a standard deviation of 0.0385 Hz. This technique would not be computationally intensive to implement in a microcontroller.

These graphs show that with ~$3V_{RMS}$ of noise in the system, it is still possible to achieve a very accurate measure of the LDC frequency, with standard deviations of no more than 0.04 Hz. It can also be seen that even with unrealistically high amounts of noise, a relatively high level of measurement accuracy can still be obtained. With ~$10V_{RMS}$ of noise in the system, the standard deviation of the final method is 0.6142, which is still usable even with this unrealistically high amount of noise.

A practical system has been tested within a laboratory scale micro grid. The signal injection is setup as described previously. A 300:4 turn injection transformer was used, with the injection inverter running off the same voltage as the rest of the system.

The upper and lower frequencies used here were 710 Hz and 864 Hz. These are right on the outside of the filters bandwidth, so are used to show the worst case scenario. The 710 Hz has the worst performance as it is not only on the very outside of filter band but is closer to the 50 Hz and consequently further attenuated by the high pass filter. The mains voltage of the system is shown in FIG. 31.

Here there is 42.5 dBV of the 50 Hz component and 10.625 dBV of the 864 Hz component, giving a −31.875 dB difference between the two. The high pass filter output is shown in FIG. 32. There is 3.125 dBV of 50 Hz and −19.375 dBV of 868 Hz making the new difference −22.5 dB between the two.

Figure 34:
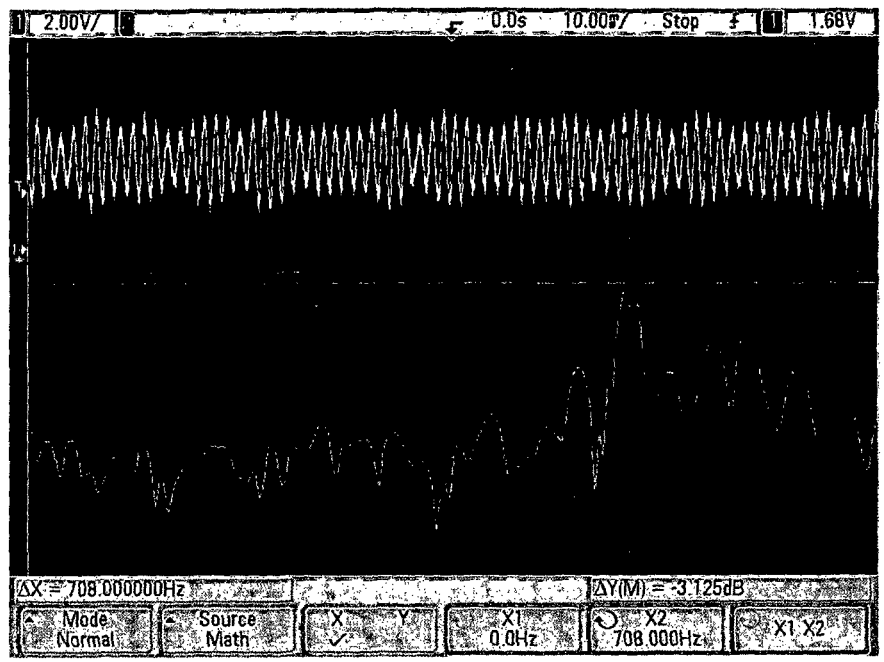

The band pass filter outputs for 710 Hz and 864 Hz are shown in FIGS. 33 and 34. At 864 Hz, the signal magnitude is 1.875 dBV and at 710 Hz, the output is −3.125 dBV. There is now no perceivable 50 Hz, but there is at least 20 dB of clearance to the nearest spectral component.

Since the 50 Hz has been eliminated, other spectral noise components must be investigated. The band pass filter itself has above unity gain within its band, and is therefore capable of amplifying noise in the system. When the signal injection system is turned off, there is −15.625 dBV of 850 Hz as shown in FIG. 35. With −3.125 dBV of actual signal at 710 Hz, this gives 12.5 dB as the minimum signal to noise ratio. At 868 Hz it is 17.5 dB which is significantly better.

A Schmidt trigger is then used to square up the signal for measurement. The hysteresis band is designed such that a signal just within the desired band is picked up and the rest ignored.

Figure 36:
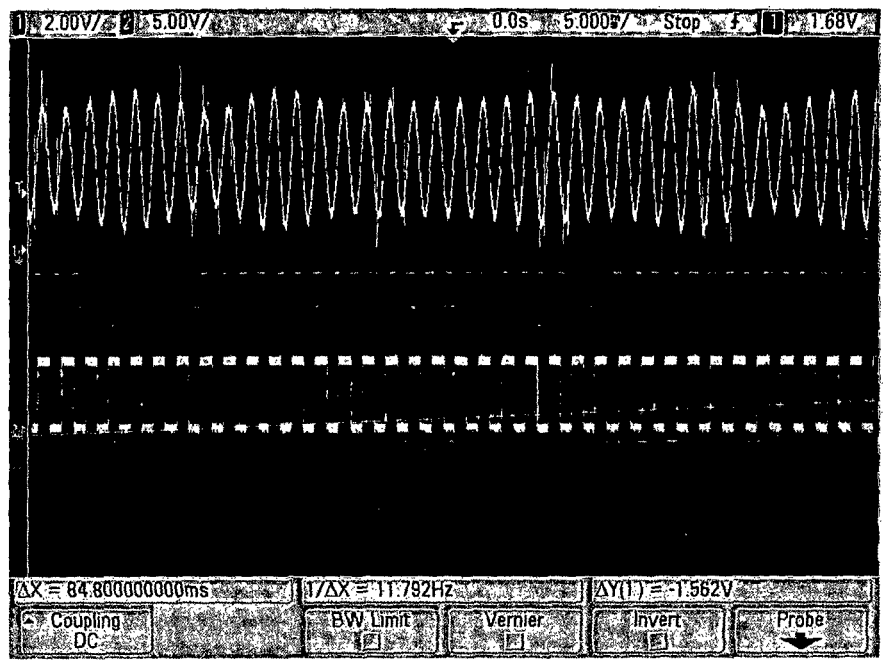

At 733 Hz there is 3.5V of signal and a clean square wave as shown in FIG. 36.

Figure 37:
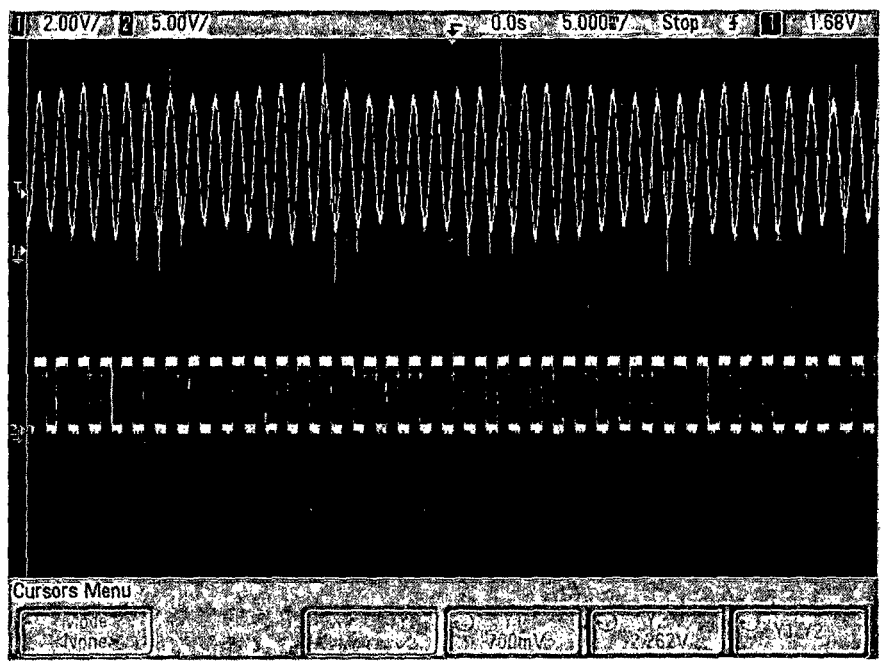

At 800 Hz there is 4V of signal and a clean square wave as shown in FIG. 37.

Figure 38:
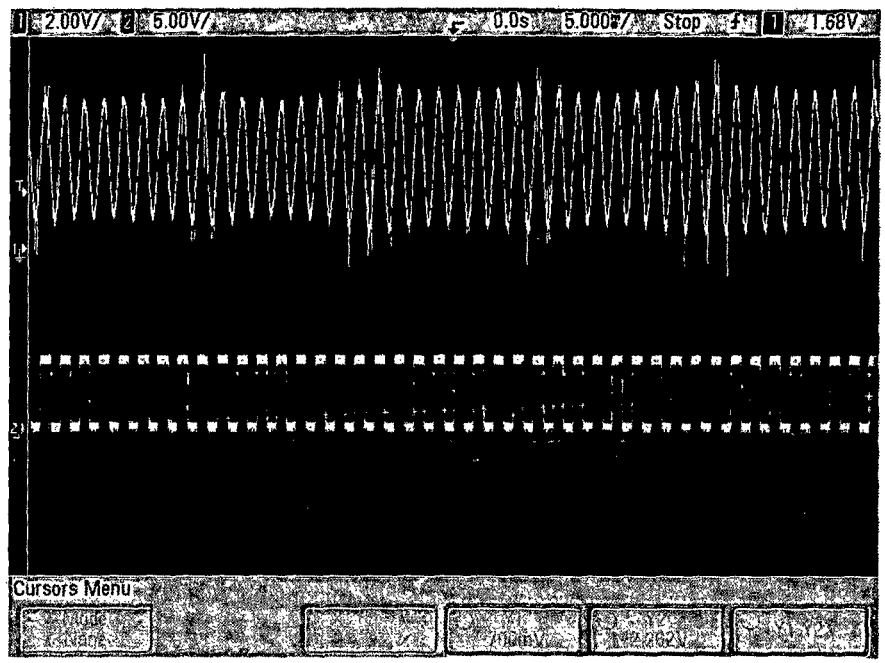

At 868 Hz there is 3.5V of signal and a clean square wave as shown in FIG. 38.

Figure 39:
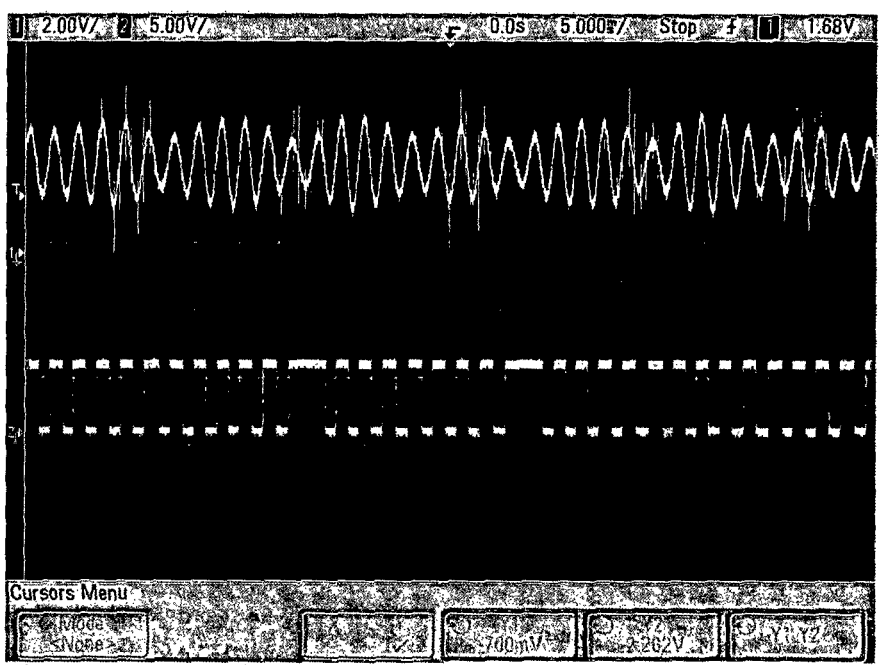

At 710 Hz there is 2V of signal and gaps in the square wave as shown in FIG. 39.

With no signal injection there is 1V of signal and no square wave output as shown in FIG. 40.

These results show that within the filtering band, the LDC signal can be picked up reliably and used for local demand control even in the presence of noise. The two filtering stages provided a total of over 70 dB of differential gain between 50 Hz and the 710 Hz to 848 Hz band. This is consistent with the results from both the analytical solution and simulation.

The LDC system using a low frequency tone as part of the control loop is a simple direct system enabling good control as it has very low latency. An alternative method for the future uses an electronic transformer in place of the conventional 50/60 Hz transformer and eliminates the need for an 800 Hz or other frequency tone. Here the conventional street transformer forming the hub of the LDC micro-grid system is replaced with the electronic transformer. In this electronic transformer the input power typically at 11 kV is rectified to a high DC voltage which is then switched electronically with a power electronic inverter producing high frequency power at a very high voltage and a high frequency of perhaps 20 kHz. This power is then transformed down in a high-frequency transformer to reduce the voltage and a 3-phase (or single phase) output voltage is synthesized at 50 Hz using another inverter. The system may use a direct AC to AC conversion or rectify to DC and invert to AC after rectification. The output voltage and all the converters in the process are reversible so that power may be sent in either direction. But the output frequency is no longer restricted to be 50 Hz and by controlling this frequency to vary according to load an alternative control signal for the islanded network may be produced. Thus, as described, if the frequency is 49.5 Hz all controllable power is switched off and if the frequency is 50.5 Hz the entire controllable load is switched on, and there is a linear variation between these two extremes. In one example the islanded system may be connected to the grid by one or more electronic transformers and the local frequency, generated at the transformer, may be used as, or as part of the control signal. In this example the tone on the neutral line, or other communications systems, may not be needed.

At present this method would be more expensive than the method described above for LDC using a low frequency tone but the high frequency transformer is already relatively lower cost, smaller, lighter and more efficient than a conventional transformer, and as semiconductor prices continue to fall the inverter costs will reduce and this method will be cost competitive. At the terminals the two systems appear identical except that the LDC one has an impressed 800 Hz tone on the utility voltage, and the electronic transformer has its own local frequency. As the frequency changes any motors on the system will change speed but as the system is fully reversible transient energy flows will be available from the grid system to enable those speed changes and stability will not be an issue.

Unless the context clearly requires otherwise, throughout the specification, the words "comprise", "comprising", and the like, are to be construed in an inclusive sense as opposed to an exclusive or exhaustive sense, that is to say, in the sense of "including, but not limited to".

It should be noted that various changes and modifications to the presently preferred embodiments described herein will be apparent to those skilled in the art. Such changes and modifications may be made without departing from the spirit and scope of the invention and without diminishing its attendant advantages. It is therefore intended that such changes and modifications be included within the present invention.

The invention claimed is:

1. An apparatus for production of a control signal for a demand side electric power supply management system, comprising:
   means to accept set point;
   measurement means to measure power flow into a supply network; and
   means to convert information from the measurement means into a control signal for transmission over the network wherein the frequency of the control signal is indicative of the power available to the network.

2. The apparatus as claimed in claim 1 wherein the network is supplied by a transformer and the measurement means measures the power supplied by or at the transformer.

3. The apparatus as claimed in claim 1 wherein the control signal comprises a low voltage signal relative to the voltage of the network.

4. The apparatus as claimed in claim 1 wherein the apparatus for producing the control signals is capable of sourcing a high current relative to the current required by individual loads supplied by the network.

5. The apparatus as claimed in claim 3 wherein the control signal comprises a signal in the range of substantially 1-3 volts at 50-500 A.

6. The apparatus as claimed in claim 1 wherein the control signal frequency is substantially in the range of 300-1200 Hz.

7. The apparatus as claimed in claim 1 wherein the control signal is provided between a neutral line and an earth connection of the network.

8. The apparatus as claimed in claim 1 wherein the control signal is inductively coupled to the network.

9. The apparatus as claimed in claim 1 wherein the apparatus derives the control signal by integrating the difference between the measured power flow and the set point.

10. The apparatus as claimed in claim 1 wherein the control signal comprises the frequency of the power supplied over the network.

11. A utility power supply network including an apparatus for production of a control signal for a demand side electric power supply management system, the apparatus comprising:
    means to accept set point;
    measurement means to measure power flow into a supply network;
    means to convert information from the measurement means into a control signal for transmission over the network wherein the frequency of the control signal is indicative of the power available to the network.

12. A method of providing a control signal for a demand side electric power supply management system, the method comprising:
    measuring power flow into a supply network relative to a set point; and
    converting information from the measurement means into a control signal for transmission over the network wherein the frequency of the control signal is indicative of the power available on the network.

13. The method as claimed in claim 12 including varying the set point.

14. A load controller for a demand side electric power supply management system, the controller comprising:
    priority designation means for designating a priority for one or more loads supplied by the system;
    frequency detection means for detecting the frequency of a control signal; and
    means to control the one or more loads dependent on the control signal and designated priority assigned to that or each load.

15. The load controller as claimed in claim 14 wherein the control signal is obtained directly from the network supply power to the one or more loads.

* * * * *